(12) United States Patent
Chou et al.

(10) Patent No.: US 9,064,549 B2
(45) Date of Patent: Jun. 23, 2015

(54) MEMORY DEVICE

(71) Applicant: Industrial Technology Research Institute, Hsinchu (TW)

(72) Inventors: Yung-Fa Chou, Kaohsiung (TW); Ding-Ming Kwai, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/267,879

(22) Filed: May 1, 2014

(65) Prior Publication Data

US 2015/0049569 A1 Feb. 19, 2015

(30) Foreign Application Priority Data

Aug. 19, 2013 (TW) .............................. 102129671 A

(51) Int. Cl.
| | |
|---|---|
| *G11C 5/06* | (2006.01) |
| *G11C 8/10* | (2006.01) |
| *G11C 8/14* | (2006.01) |
| *G11C 5/02* | (2006.01) |
| *G11C 7/18* | (2006.01) |
| *G11C 5/14* | (2006.01) |

(52) U.S. Cl.
CPC ........ *G11C 5/063* (2013.01); *G11C 8/10* (2013.01); *G11C 8/14* (2013.01); *G11C 5/025* (2013.01); *G11C 7/18* (2013.01); *G11C 5/14* (2013.01)

(58) Field of Classification Search
CPC .......... G11C 5/025; G11C 5/063; G11C 7/18; G11C 8/10; G11C 8/14
See application file for complete search history.

(56) References Cited

U.S. PATENT DOCUMENTS

| | | | | |
|---|---|---|---|---|
| 4,730,280 | A | * | 3/1988 | Aoyama ....................... 365/205 |
| 5,315,541 | A | | 5/1994 | Harari et al. |
| 5,829,026 | A | | 10/1998 | Leung et al. |
| 5,978,302 | A | | 11/1999 | Merritt |
| 6,075,745 | A | | 6/2000 | Gould et al. |

(Continued)

FOREIGN PATENT DOCUMENTS

TW 419672 1/2001

OTHER PUBLICATIONS

"Larger L3 cache in Shanghai, Part I," AMD Developer Central (AMD developer Blog), posted Nov. 13, 2008 [retrieved on Apr. 5, 2015]. Retrieved from the Internet <URL: http://developer.amd.com/community/blog/2008/11/13/larger-l3-cache-in-shanghai-part-i/>.*

(Continued)

*Primary Examiner* — Harry W Byrne
*Assistant Examiner* — Lance Reidlinger
(74) *Attorney, Agent, or Firm* — Jianq Chyun IP Office

(57) ABSTRACT

A memory device including at least one bit-line decoding circuit, at least one word-line decoding circuit, a plurality of memory blocks, and a plurality of switches is provided. The sizes of the plurality of memory blocks include at least one first size and a second size, and the first size is greater than the second size. The plurality of memory blocks with the first size are grouped as at least one first group, and the plurality of memory blocks with the second size are grouped as at least one second group. Compared to the first group, the second group is closer to the bit-line decoding circuit and/or the word-line decoding circuit. The switches are controlled by at least one control signal, so as to enable or disable the first group and/or the second group.

27 Claims, 18 Drawing Sheets

(56) References Cited

U.S. PATENT DOCUMENTS

| | | | |
|---|---|---|---|
| 6,178,120 | B1 | 1/2001 | Lee |
| 6,208,545 | B1* | 3/2001 | Leedy ............................. 365/51 |
| 6,237,130 | B1 | 5/2001 | Soman et al. |
| 6,512,683 | B2 | 1/2003 | Hsu et al. |
| 6,859,410 | B2* | 2/2005 | Scheuerlein et al. .... 365/230.06 |
| 6,934,174 | B2* | 8/2005 | Castagnetti et al. ............ 365/51 |
| 6,961,269 | B2 | 11/2005 | Royer |
| 7,423,918 | B2 | 9/2008 | Royer |
| 7,650,481 | B2 | 1/2010 | Walker |
| 7,990,795 | B2 | 8/2011 | Pelley, III et al. |
| 8,045,413 | B2 | 10/2011 | Demone |
| 8,477,554 | B2* | 7/2013 | Yu et al. ........................ 365/226 |
| 2011/0205828 | A1 | 8/2011 | Richter et al. |
| 2011/0296118 | A1 | 12/2011 | Carter et al. |
| 2014/0268978 | A1* | 9/2014 | Choi et al. ...................... 365/63 |

OTHER PUBLICATIONS

Arimoto et al., "A speed-enhanced DRAM array architecture with embedded ECC," IEEE Journal of Solid-State Circuits, Feb. 1990, pp. 11-17.

Sakakibara et al., "A 750MHz 144Mb Cache DRAM LSI with Speed Scalable Design and Programmable at-Speed Function-Array BIST," 2003 IEEE International Solid-State Circuits Conference, Feb. 13, 2003, pp. 458-508.

Nakamura et al., "A 29-ns 64-Mb DRAM with hierarchical array architecture," IEEE Journal of Solid-State Circuits, Sep. 1996, pp. 1302-1307.

Itoh et al., "Limitations and Challenges of Multigigabit DRAM Chip Design," IEEE Journal of Solid-State Circuits, May 1997, pp. 624-634.

Inukai et al., "High Speed DRAM Architecture Movement," 1998 Symposium on VLSI Circuits, Jun. 1998, pp. 76-77.

Li et al., "DRAM performance improvement by lowering interconnect capacitance," Proceedings of the IEEE 2001 International Interconnect Technology Conference, Jun. 6, 2001, pp. 78-80.

Hsu et al., "Dynamic Addressing Memory Arrays with Physical Locality," Proceedings of the 35 th Annual IEEE/ACM International Symposium on Microarchitecture, Nov. 2002, pp. 161-170.

Kim et al., "A 1.2 V 12.8 GB/s 2 Gb Mobile Wide-I/O DRAM With 4×128 I/Os Using TSV Based Stacking," IEEE Journal of Solid-State Circuits, January 2012, pp. 107-116.

Han et al., "Skew Minimization Techniques for 256M-bit Synchronous DRAM and beyond," 1996 Symposium on VLSI Circuits, Jun. 13-15, 1996, pp. 192-193.

Yuan et al., "A Hybrid Analytical DRAM Performance Model," 5th Workshop on Modeling, Benchmarking and Simulation, Jun. 21, 2009, pp. 1-10.

Liu et al., "Flikker: Saving DRAM Refresh-power through Critical Data Partitioning," Proceedings of the sixteenth international conference on Architectural support for programming languages and operating systems ASPLOS XVI, Mar. 5-11, 2011, pp. 213-224.

\* cited by examiner

US 9,064,549 B2

MEMORY DEVICE

CROSS-REFERENCE TO RELATED APPLICATION

This application claims the priority benefit of Taiwan application serial no. 102129671, filed on Aug. 19, 2013. The entirety of the above-mentioned patent application is hereby incorporated by reference herein and made a part of this specification.

TECHNICAL FIELD

The disclosure relates to a memory device.

BACKGROUND

With the advent of multi-core processor, the clock rate of the processor may be adaptively adjusted according to the number of cores in use. When the number of cores in use is smaller, the processor could operate at a higher clock rate. Each core may access a portion of the dynamic random access memory (DRAM) for data storage. However, it is difficult for the DRAM to adjust its clock rate in accordance with the processor. Thus, even though the processing speed of the processor may increase due to few cores being in use, the overall performance bottleneck may be severely limited by the data access to the DRAM, as the gap of clock rates between the processor and the DRAM has been widened.

SUMMARY

One of exemplary embodiments is directed to a memory device. The memory device includes at least one bit-line decoding circuit, at least one word-line decoding circuit, a plurality of memory blocks, and a plurality of switches. The plurality of memory blocks are coupled to the at least one bit-line decoding circuit and the at least one word-line decoding circuit, and the sizes of the plurality of memory blocks at least include a first size and a second size, wherein the first size is greater than the second size. The plurality of memory blocks having the first size are grouped as at least one first group, the plurality of memory blocks having the second size are grouped as at least one second group, and compared to the first group, the at least one second group is closer to the bit-line decoding circuits and/or the word-line decoding circuits. The switches are coupled between the first group and the second group, wherein the switches are controlled by at least one control signal so as to enable or disable the first group and/or the second group according to the control signal.

One of exemplary embodiments is also directed to a memory device that includes at least one bit-line decoding circuit, at least one word-line decoding circuit, a plurality of memory blocks, and a plurality of switches. The plurality of memory blocks are coupled to the bit-line decoding circuit and the word-line decoding circuit. The sizes of the plurality of memory blocks at least include a first size and a second size, wherein the first size corresponds to the first memory capacity accessed and selected by p bit lines and q word lines, respectively, the second size corresponds to the second memory capacity accessed and selected by r bit lines and s word lines, respectively, and the product of p and q is greater the product of r and s. The plurality of memory blocks having the first size are grouped as at least one first group, the plurality of memory blocks having the second size are grouped as at least one second group, and in comparison with the first group, the second group is closer to the bit-line decoding circuits and/or the word-line decoding circuits. The switches are coupled between the first group and the second group, wherein the switches are controlled by at least one control signal so as to enable or disable the first group and/or the second group according to the control signal.

Several exemplary embodiments accompanied with figures are described in detail below to further describe the disclosure in details.

BRIEF DESCRIPTION OF THE DRAWINGS

The accompanying drawings are included to provide a further understanding of the invention, and are incorporated in and constitute a part of this specification. The drawings illustrate exemplary embodiments and, together with the description, serve to explain the principles of the disclosure.

DESCRIPTION OF THE EMBODIMENTS

The accompanying drawings are included to provide further understanding, and are incorporated in and constitute a part of this specification. The drawings illustrate exemplary embodiments and, together with the description, serve to explain the principles of the disclosure.

First Embodiment

Figure 1A:
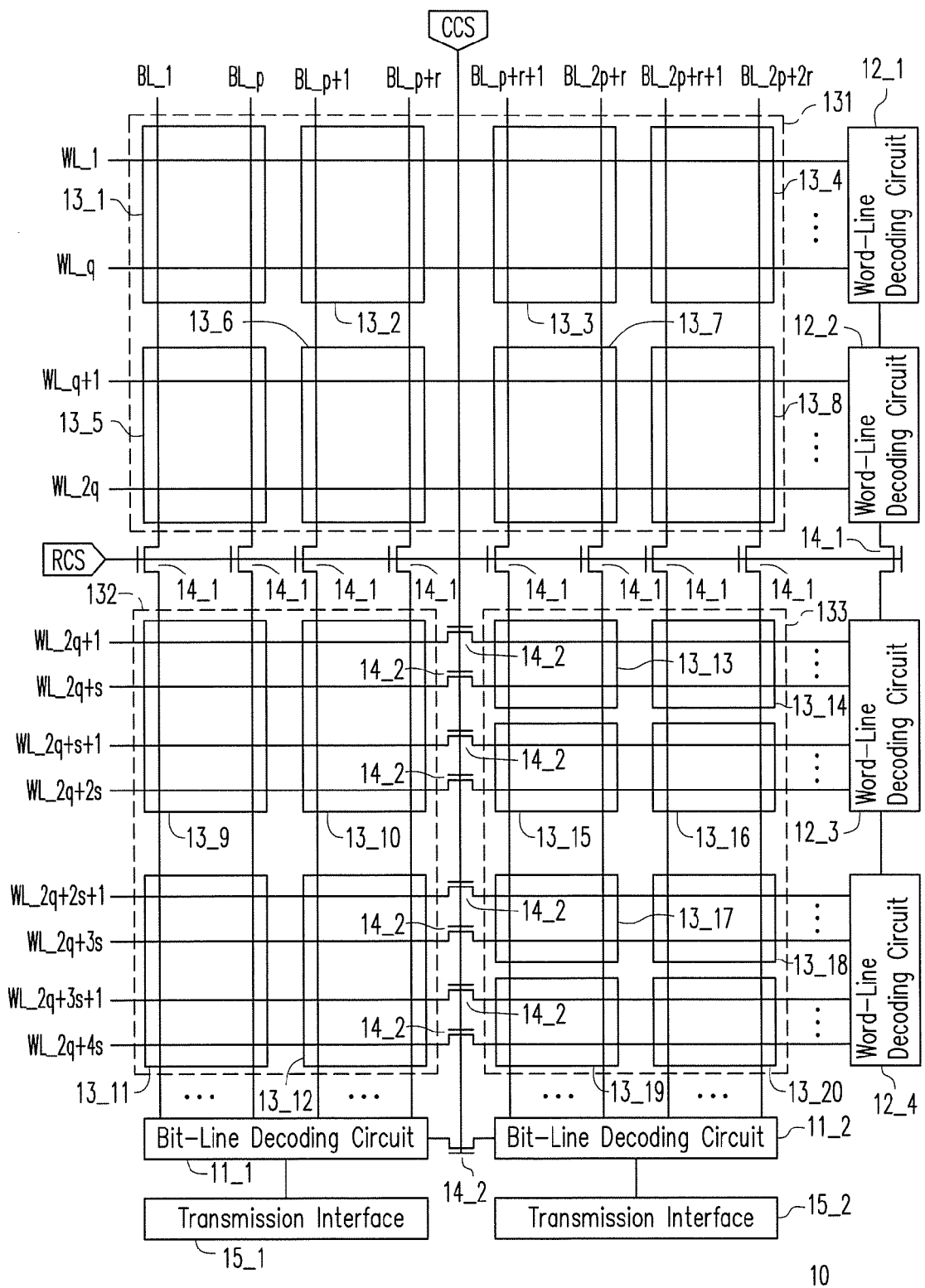
FIG. 1A and FIG. 1B are schematic diagrams of a memory device according to a first embodiment of the disclosure.
Figure 1B:
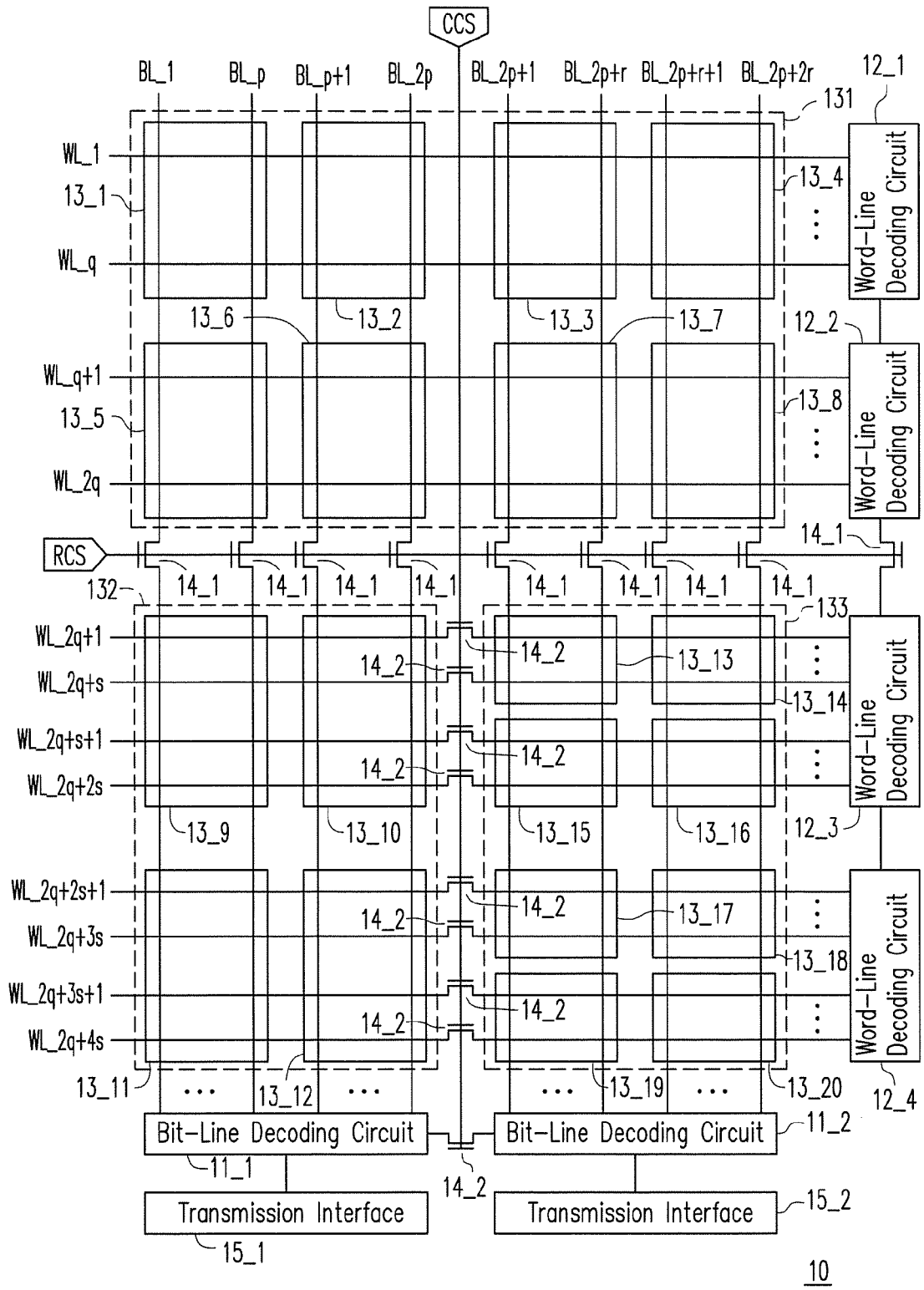

FIG. 1A and FIG. 1B are schematic diagrams of a memory device according to a first embodiment of the disclosure. The same components in FIG. 1A and FIG. 1B share the same reference numbers, and people reducing the disclosure to practice may refer to the detailed descriptions provided in the following embodiments for the same components. As shown in FIG. 1A and FIG. 1B, a memory device 10 includes bit-line decoding circuits 11_1-11_2, word-line decoding circuits 12_1-12_4, memory blocks 13_1-13_20, switches 14_1-14_2, and transmission interfaces 15_1-15_2. It should be mentioned that the number of each component in FIG. 1A and FIG. 1B are merely exemplary, and those skilled in the art may adjust the number of each component according to the actual requirements. For example, in the present embodiment, the number of the bit-line decoding circuits 11_1-11_2 and the number of the word-line decoding circuits 12_1-12_4 are both plural. However, in another embodiment, the number of the bit-line decoding circuits 11_1-11_2 may be one merely (i.e., merely the bit-line decoding circuit 11_2 exists), and the number of the word-line decoding circuit 12_1-12_4 may be plural. In yet another embodiment, the number of the bit-line decoding circuits 11_1-11_2 may be plural, and the number of the word-line decoding circuits 12_1-12_4 may be one (i.e., merely the word-line decoding circuit 12_4 exists). In the present embodiment, the memory device 10 includes different kinds of volatile memory devices, such as dynamic random access memory (DRAM) and/or static random access memory (SRAM), but non-volatile memory devices may also be applicable in the disclosure.

The bit-line decoding circuits 11_1-11_2 and the word-line decoding circuits 12_1-12_4 are the basic read/write units of the memory device 10 and may decode column addresses and row addresses, respectively, in order to select the memory cells in the memory blocks 13_1-13_20 to be read out or written in. In addition, the bit-line decoding circuits 11_1-11_2 may further include multiplexers and signal amplification circuits, which will not be elaborated.

The memory blocks 13_1-13_20 are coupled to the bit-line decoding circuits 11_1-11_2 and the word-line decoding circuits 12_1-12_4. Here, the memory blocks 13_1-13_20 are the basic storage units of the memory device 10. For example, the memory blocks 13_1-13_20 may further include memory cells, each composed of an access transistor and a storage capacitor so as to retain or deplete charges.

In FIG. 1A, the bit-line decoding circuit 11_1 has p+r bit lines, e.g., bit lines BL_1-BL_p and BL_p+1-BL_p+r. For example, the bit-line decoding circuit 11_1 may be coupled to the memory blocks 13_1, 13_5, 13_9, and 13_11 through the bit lines BL_1-BL_p and coupled to the memory blocks 13_2, 13_6, 13_10, and 13_12 through the bit lines BL_p+1-BL_p+r. The bit-line decoding circuit 11_2 may also have p+r bit lines, e.g., bit lines BL_p+r+1-BL_2p+r and BL_2p+r+1-BL_2p+2r. For example, the bit-line decoding circuit 11_2 may be coupled to the memory blocks 133, 13_7, 13_13, 13_15, 13_17, and 13_19 through the bit lines BL_p+r+1-BL_2p+r and coupled to the memory blocks 13_4, 13_8, 13_14, 13_16, 13_18, and 13_20 through the bit lines BL_2p+r+1-BL_2p+2r. It is worth mentioning that r may be or may not be equal to p. In the present embodiment, the number r of bit lines and the number p of bit lines are set as equal number for illustrative purposes. For example, when r is equal to p, the bit-line decoding circuit 11_1 has 2p bit lines, i.e., bit lines BL_1-BL_p and BL_p+1-BL_2p (BL_p+r). The bit-line decoding circuit 11_1 may be coupled to the memory blocks 13_1, 13_5, 13_9, and 13_11 through bit lines BL_1-BL_p and coupled to the memory blocks 13_2, 13_6, 13_10, and 13_12 through bit lines BL_p+1-BL_2p (BL_p+r). When r is equal to p, the bit-line decoding circuit 11_2 may also have 2r bit lines, i.e., bit lines BL_2p+1 (BL_p+r+1)-BL_2p+2r. The bit-line decoding circuit 11_2 may be coupled to the memory blocks 13_3, 13_7, 13_13, 13_15, 13_17, and 13_19 through bit lines BL_2p+1(BL_p+r+1)-BL_2p+r and coupled to the memory blocks 13_4, 13_8, 13_14, 13_16, 13_18, and 13_20 through bit lines BL_2p+r+1-BL_2p+2r.

In FIG. 1B, the bit-line decoding circuit 11_1 has 2p bit lines, e.g., bit lines BL_1-BL_p and BL_p+1-BL_2p. For example, the bit-line decoding circuit 11_1 may be coupled to the memory blocks 13_1, 13_5, 13_9, and 13_11 through the bit lines BL_1-BL_p and coupled to the memory blocks 13_2, 13_6, 13_10, and 13_12 through the bit lines BL_p+1-BL_2p. The bit-line decoding circuit 11_2 may have 2r bit lines, e.g., bit lines BL_2p+1-BL_2p+r and BL_2p+r+1-BL_2p+2r. For example, the bit-line decoding circuit 11_2 may be coupled to the memory blocks 13_3, 13_7, 13_13, 13_15, 13_17, and 13_19 through the bit lines BL_2p+1-BL_2p+r and coupled to the memory blocks 13_4, 13_8, 13_14, 13_16, 13_18, and 13_20 through the bit lines BL_2p+r+1-BL_2p+2r.

As shown in FIG. 1A and FIG. 1B, the word-line decoding circuits 12_1-12_4 may each have q word lines. For example, the word-line decoding circuit 12_1 may be coupled to the memory blocks 13_1-13_4 through word lines WL_1-WL_q. The word-line decoding circuit 12_2 is coupled to the memory blocks 13_5-13_8 through word lines WL_q+1-WL_2q. The word-line decoding circuit 12_3 may be coupled to the memory blocks 13_9 and 13_10, through word lines WL_2q+1-WL_2q+s and WL_2q+s+1-WL_2q+2s, coupled to the memory blocks 13_13-13_14 through word lines WL_2q+1-WL_2q+s, and coupled to the memory blocks 13_15-13_16 through word lines WL_2q+s+1-WL_2q+2s. The word-line decoding circuit 12_4 is coupled to the memory blocks 13_11 and 13_12, through WL_2q+2s+1-WL_2q+3s and WL_2q+3s+1-WL_2q+4s, coupled to the memory blocks 13_17-13_18 through WL_2q+2s+1-WL_2q+3s, and coupled to the memory blocks 13_19-13_20 through WL_2q+3s+1-WL_2q+4s. In one embodiment, s may be q/2, q/3, q/4, and so forth; and s may be or may be not equal to q.

The memory blocks 13_1-13_20 at least include the memory blocks having the first size and the memory blocks having the second size, wherein the first size is greater than the second size. For example, the second size is a half of the first size. In other words, the available memory capacity of the memory blocks having the second size is a half of that of the memory blocks having the first size. It is not limited in the disclosure thereto. Assuming that p is set to be equal to r in the disclosure, the memory blocks 13_1-13_12 have the first size and the memory blocks 13_13-13_20 have the second size. The memory capacities of the memory blocks 13_1-13_20 are positively correlated with the size of the memory blocks 13_1-13_20 (i.e., the greater the size of the memory block, the greater the number of bit lines and/or word lines in the memory block); therefore, the first size may correspond to the first memory capacity of p bit lines and q word lines, the second size may correspond to the second memory capacity of r bit lines and s bit lines, and the sizes or the memory capacities of the memory blocks 13_1-13_20 may be expressed by the products of the bit lines and the word lines included by or passing through the memory blocks 13_1-13_20.

Figure 2A:
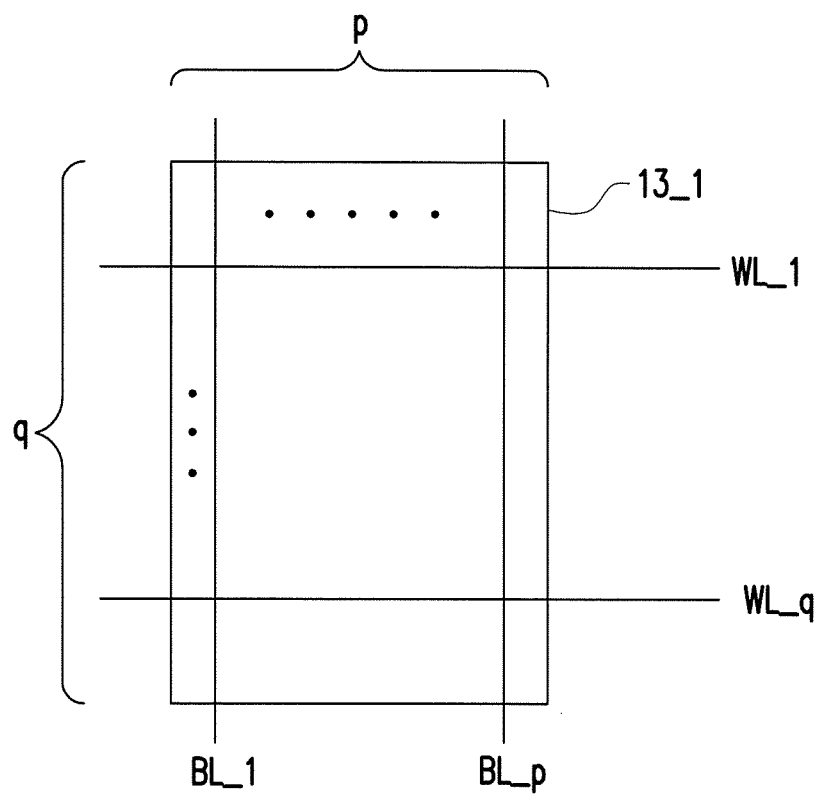
FIG. 2A is a schematic diagram of the memory block having the first size according to the first embodiment of the disclosure.
Figure 2B:
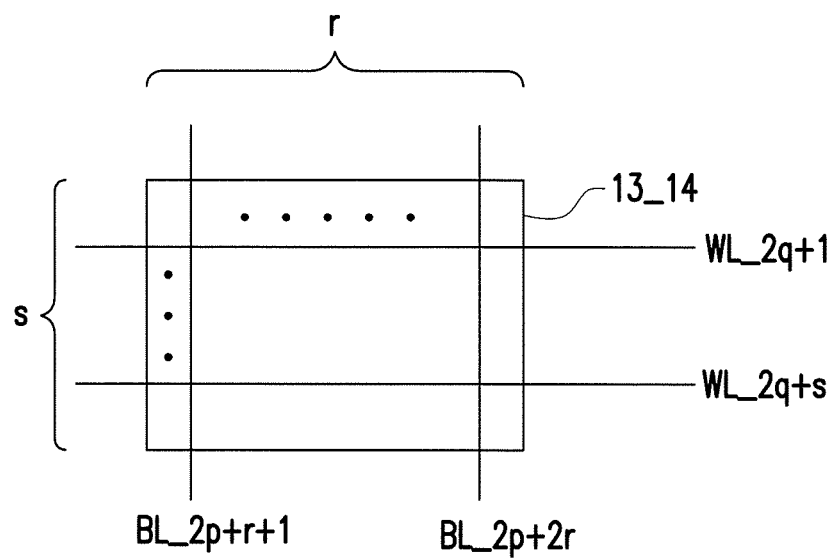
FIG. 2B is a schematic diagram of the memory block having the second size according to the first embodiment of the disclosure.

For example, FIG. 2A is a schematic diagram of the memory block having the first size according to the first embodiment of the disclosure, and FIG. 2B is a schematic diagram of the memory block having the second size according to the first embodiment of the disclosure. As shown in FIG. 2A, the exemplary memory block 13_1 has p bit lines (bit lines BL_1-BL_p) and q word lines (WL_1-WL_q), and thus, the first size or the memory capacity of the memory block 13_1 may be expressed by pq (or p×q). As shown in 2B, the exemplary memory block 13_14 has r bit lines (bit lines BL_2p+r+1-BL_2p+2r, where p equals r in the present embodiment) and s word lines (WL_2q+1-WL_2q+s), and thus, the second size or the memory capacity of the memory block 13_14 is expressed by rs (or r×s). However, the disclosure is not limited to the aforementioned examples. For instance, in one embodiment, as long as the number of bit lines and/or word lines passing through the memory blocks is changed, the aforementioned first size and/or second size are/is changed as well.

It is worth mentioning that p is set to be equal to r in the present embodiment, so that the number of bit lines included by or passing through the memory blocks having the first size (e.g., the memory blocks 13_1-13_12) is the same as the number of bit lines included by or passing through the memory blocks having the second size (e.g., the memory blocks 13_13-13_20). However, in another embodiment, r may be less than p, e.g., r may be p/2, p/3, or p/4. In other words, the number of bit lines included by or passing through the memory blocks having the second size is less than the number of bit lines included by or passing through the memory blocks having the first size.

The memory blocks 13_1-13_12 may be grouped as the first groups 131 and 132, and the memory blocks 13_13-13_20 may be grouped as the second group 133. In the present embodiment, the ratio of the number of the memory blocks 13_1-13_12 (e.g., 12) to the number of the memory blocks 13_13-13_20 (e.g., 8) is 3:2. However, the number of the first group, the number of the second group, and the number and the ratio of the memory blocks in each group may be adjusted according to the actual requirements. For example, in one embodiment, the memory blocks 13_1-13_12 may be grouped as one first group, and the memory blocks 13_13-13_20 may be grouped as a plurality of the second groups.

In the present embodiment, compared to the first groups 131 and 132, the second group 133 is closer to the bit-line decoding circuit 11_2 and the word-line decoding circuits 12_3-12_4. In the present embodiment, the word-line decoding circuits 12_1-12_2 are adjacent to the first group 131, and the word-line decoding circuits 12_3-12_4 are adjacent to the second group 133. The bit-line decoding circuit 11_1 is adjacent to the first group 132, and the bit-line decoding circuit 11_2 is adjacent to the second group 133. In addition, the distance between the bit-line decoding circuit 11_1 and the word-line circuits 12_1-12_2 is greater than the distance between the bit-line decoding circuit 11_2 and the word-line circuits 12_3-12_4.

The switches 14_1 and 14_2 are coupled between each group described above, and the memory blocks 13_1-13_20 may be divided into the first groups 131 and 132 as well as the second group 133. The switches 14_1 and 14_2, for example, may be the circuits composed of transistors, such as metal oxide semiconductor field effect transistor (MOSFET), bipolar junction transistor (BJT), and so on, while the disclosure is not limited thereto. The switches 14_1 and 14_2 may receive at least one control signal so as to selectively enable or disable the first groups 131 and 132 as well as the second group 133. For example, in the present embodiment, the switches 14_1 may receive a row control signal RCS (or is controlled by the row control signal RCS), the switches 14_2 may receive a column control signal CCS (or is controlled by the column control signal CCS), and the first groups 131 and 132 and the second group 133 are enabled or disabled according to the row control signal RCS and the column control signal CCS. For example, when the row control signal RCS is at high level (e.g., logic high), the switches 14_1 are turned on (ON), and when the row control signal RCS is at low level (e.g., logic low), the switches 14_1 are turned off (OFF). Similarly, when the column control signal CCS is at high level, the switches 14_2 are turned on, and when the column control signal CCS is at low level, the switches 142 are turned off.

When the groups (or the memory blocks) far from the bit-line decoding circuits 11_1-11_2 and the word-line decoding circuits 12_1-12_4 are enabled (for example, the memory block 13_1 is enabled), signal transmission requires significant time, and thus the overall data access speed of the memory device 10 is slow, and the maximum operable frequency of the memory device 10 is low. On the contrary, when the groups (or the memory blocks) far from the bit-line decoding circuits 11_1-11_2 and the word-line decoding circuits 12_1-12_4 are disabled, and the groups (or the memory blocks) close to the bit-line decoding circuits 11_1-11_2 and the word-line decoding circuits 12_1-12_4 are enabled (for example, merely the memory blocks 13_13-13_20 are enabled), the time required for signal transmission is short in comparison with the above, and thus the overall data access speed of the memory device 10 is fast, and the maximum operable frequency of the memory device 10 is high. In addition, the memory blocks of the groups that are enabled could participate in the operations of the memory device 10, but the memory blocks of the groups that are disabled could not participate in the operations of the memory device 10. Therefore, when the first groups 131 and 132 and the second group 133 are selectively enabled or disabled, the available memory capacity of the memory device 10 may be adjusted adaptively.

In the present embodiment, the switches 14_1 may also be coupled between the word-line decoding circuits 12_2 and 12_3 and may selectively enable or disable the word-line decoding circuits 12_1 and 12_2 according to the row control signal RCS. For example, when the row control signal RCS is at high level, the word-line decoding circuits 12_1-12_4 are enabled. When the row control signal RCS is at low level, merely the word-line decoding circuits 12_3 and 12_4 are enabled, and the word-line decoding circuits 12_1 and 12_2 are disabled. Similarly, the switches 14_2 may also be coupled between the bit-line decoding circuits 11_1 and 11_2 and may selectively enable or disable the bit-line decoding circuit 11_1 according to the column control signal CCS. When the column control signal CCS is at high level, the bit-line decoding circuits 11_1 and 11_2 are both enabled. When the column control signal CCS is at low level, the bit-line decoding circuit 11_2 is enabled, and the bit-line decoding circuit 11_1 is disabled.

In addition, the bit-line decoding circuits 11_1 and 11_2 are also coupled to the transmission interfaces 15_1 and 15_2, and the transmission interfaces 15_1 and 15_2 are further coupled to a processor (e.g., a processor in a computer system or an electronic device) to be used as a data transmission path between the processor and the memory device 10. Generally speaking, the number of the processor cores may correspond to the number of the transmission interfaces of the memory device. When one core of the processor is working, merely one transmission interface of the memory device is required, and less memory blocks are used, so that the data access speed of the memory device 10 is faster. On the contrary, when multiple cores of the processor are working, multiple transmission interfaces and more memory blocks could be used. However, when more transmission interfaces of the memory device are used simultaneously, the overall data access speed of the memory device may decrease.

As exemplarily shown in FIG. 1A and FIG. 1B, when the transmission interfaces 15_1 and 15_2 of the memory device 10 are both under normal operations, the overall data access speed of the memory device 10 is slower than the overall data access speed of the memory device 10 when merely the transmission interface 15_2 is used. As a result, in the present embodiment, when the bit-line decoding circuit 11_1 is enabled selectively, the transmission interface 15_1 coupled to the bit-line decoding circuit 11_1 is also enabled. When the bit-line decoding circuit 11_1 is disabled selectively, the transmission interface 15_1 coupled to the bit-line decoding circuit 11_1 is also disabled; thereby, the data access speed of the memory device 10 may be adjusted flexibly.

In the following Table 1, different available memory capacities, transmission interfaces, and operation frequencies of the memory device 10 corresponding to different row control signals and column control signals are given. In this embodiment, p is equal to r, and s is equal to q/2. FIG. 3A through FIG. 3D are schematic diagrams of an enabling status of groups corresponding to different row control signals and column control signals according to the first embodiment of the disclosure. In addition, "1" in Table 1 represents the high level (e.g., logic high) of the row control signal RCS and the column control signal CCS, and "0" represents the low level (e.g., logic low) of the row control signal RCS and the column control signal CCS.

TABLE 1

| RCS | CCS | Available Memory Capacity | Transmission Interface Data Width | Operation Frequency |
|---|---|---|---|---|
| 0 | 0 | 8rs | Half | The first operation frequency (The maximum operation frequency) |
| 0 | 1 | 4pq + 8rs | All | The second operation frequency |
| 1 | 0 | 4pq + 8rs | Half | The third operation frequency |
| 1 | 1 | 12pq + 8rs | All | The fourth operation frequency (Normal operation frequency) |

Figure 3A:
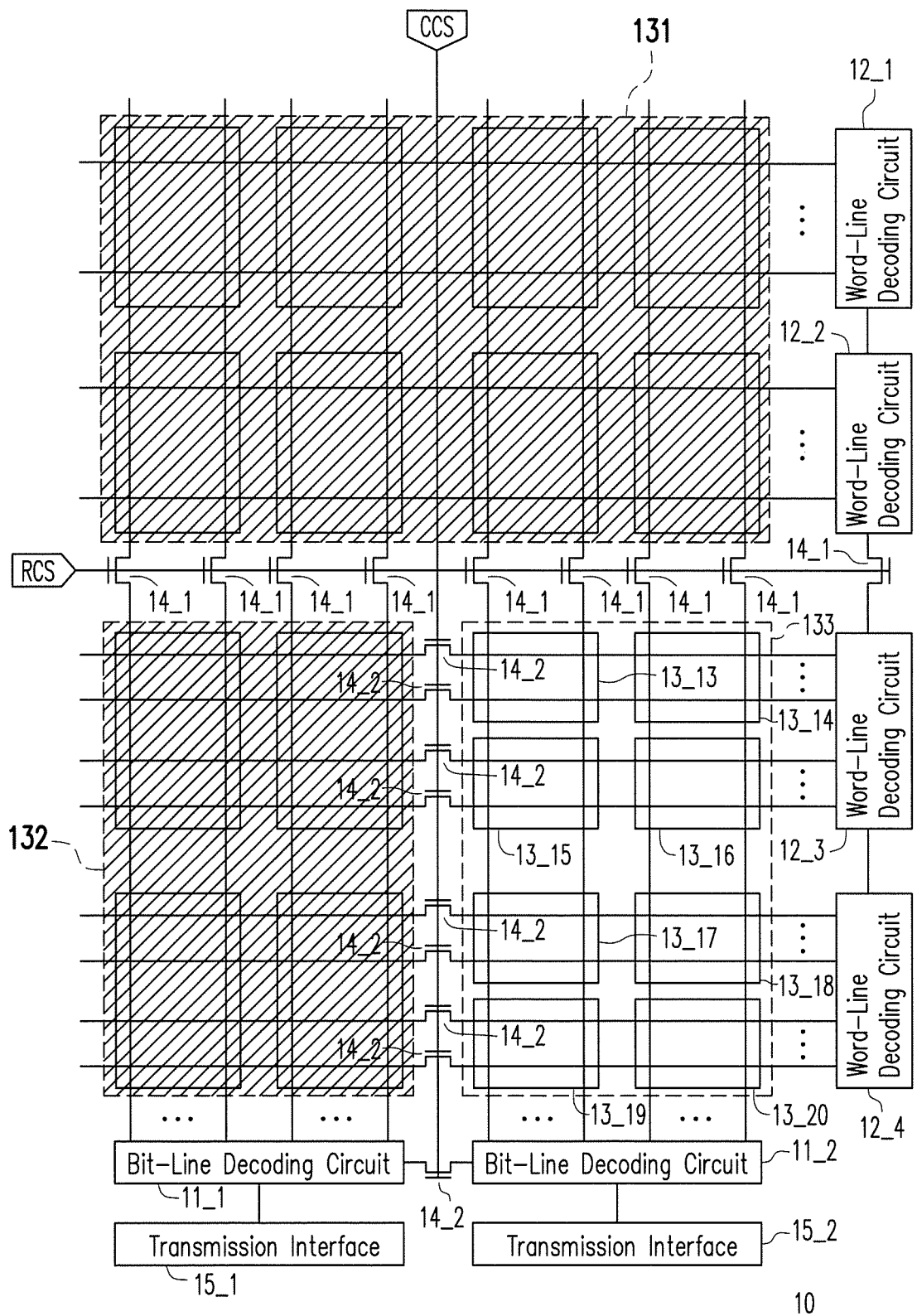
FIG. 3A through FIG. 3D are schematic diagrams of an enabling status of groups corresponding to different row control signals and column control signals according to the first embodiment of the disclosure.

As shown in Table 1 and FIG. 1A and FIG. 1B, when the row control signal RCS and the column control signal CCS are both "0", the switches 14_1 and 14_2 are turned off, and thereby the first groups 131 and 132 are disabled, and the second group 133 is enabled (as illustrated in FIG. 3A). Besides, merely the transmission interface 15_2 could be used. In this case, because the second group 133 is the closest group to the word-line decoding circuits 12_3-12_4 and the bit-line decoding circuit 112, and merely the transmission interface 152 is used for the memory device 10 to transmit data, the maximum frequency at which the memory device 10 may operate is the first operation frequency with the fastest data access speed (i.e., the maximum operation frequency), and the available memory capacity of the memory device 10 is the sum of the memory capacity of the memory blocks 13_13-13_20 (e.g., 8rs).

Figure 3B:
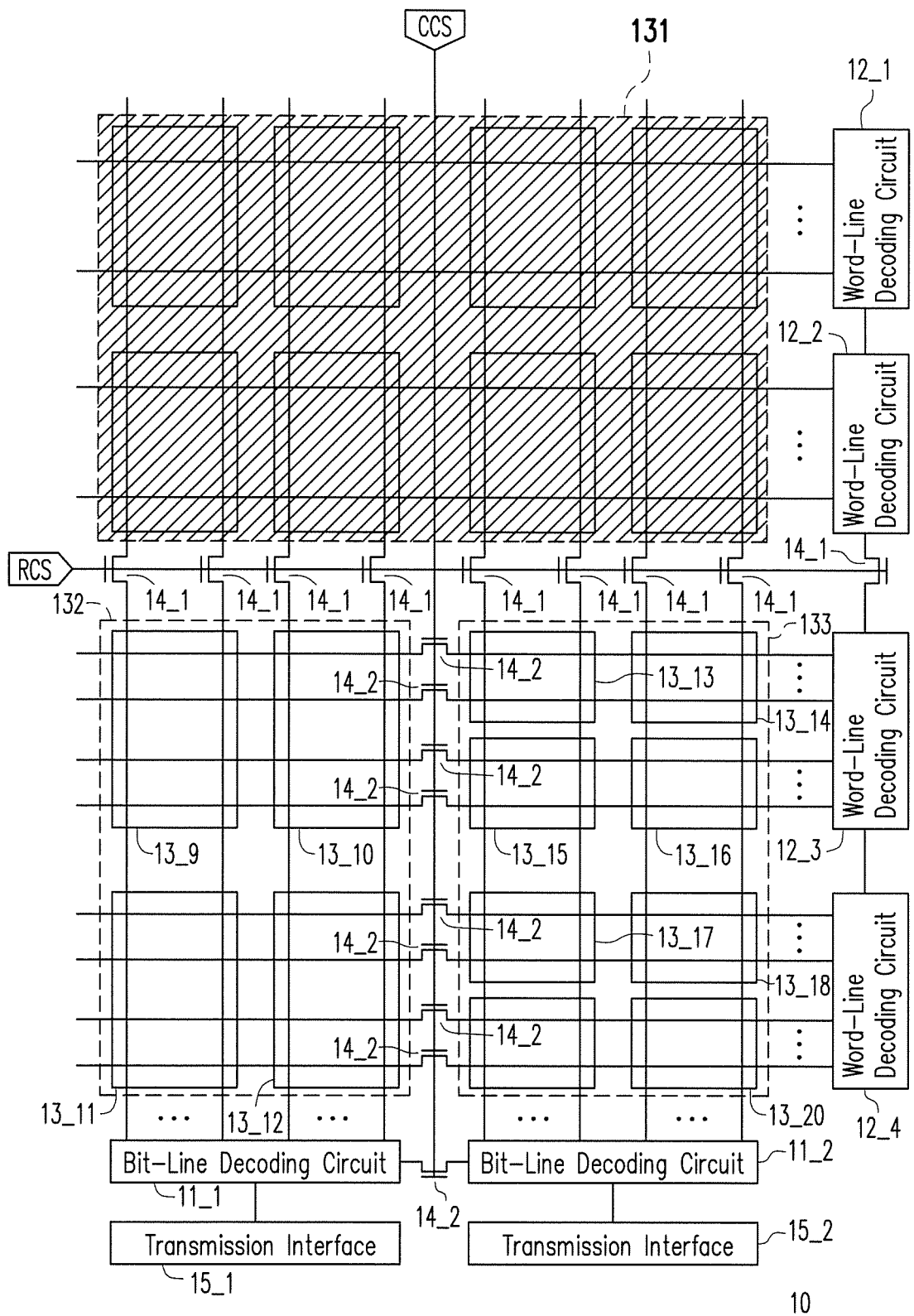

When the row control signal RCS is "0", and the column control signal CCS is "1", the switches 14_1 are turned off, and the switches 14_2 is turned on. Thus, the first group 131 is disabled, and the first group 132 and the second group 133 are enabled (as illustrated in FIG. 3B). Besides, both the transmission interfaces 15_1 and 15_2 may be used. In this case, the maximum frequency at which the memory device 10 may operate is the second operation frequency, and the available memory capacity of the memory device 10 is the sum of the memory capacity of the memory blocks 13_9-13_20 (e.g., 4pq+8rs).

Figure 3C:
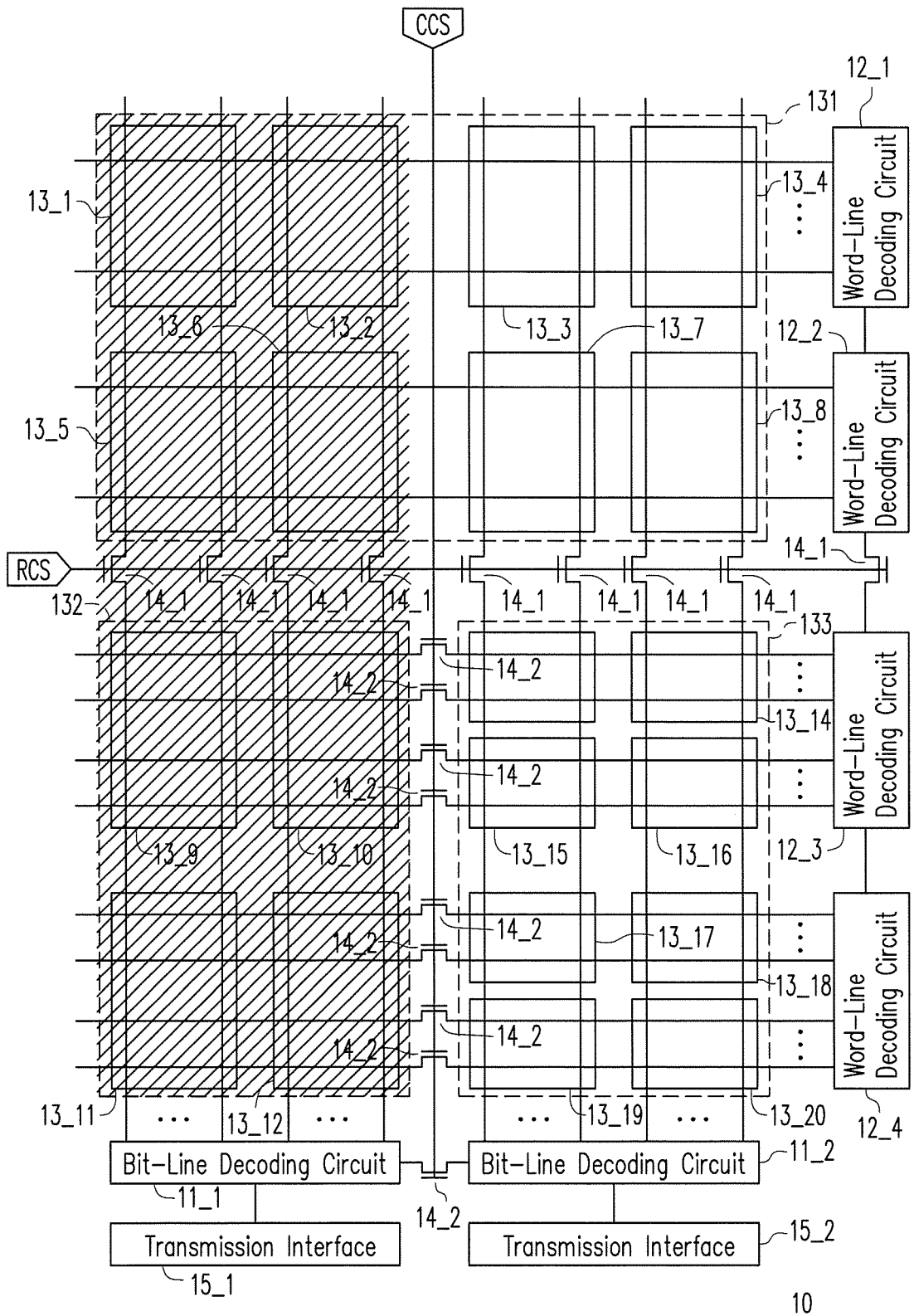

When the row control signal RCS is "1", and the column control signal CCS is "0", the switches 14_1 are turned on, and the switches 14_2 are turned off. Thus, the half right of the first group 131 is enabled, the first group 132 is disabled and the second group 133 are enabled (as illustrated in FIG. 3C). The transmission interface 152 is used. In this case, the maximum frequency at which the memory device 10 may operate is the third operation frequency, and the available memory capacity of the memory device 10 is the sum of the memory capacity of the memory blocks 13_3, 13_4, 13_7, 13_8, 13_13-13_20 (e.g., 4pq+8rs).

Figure 3D:
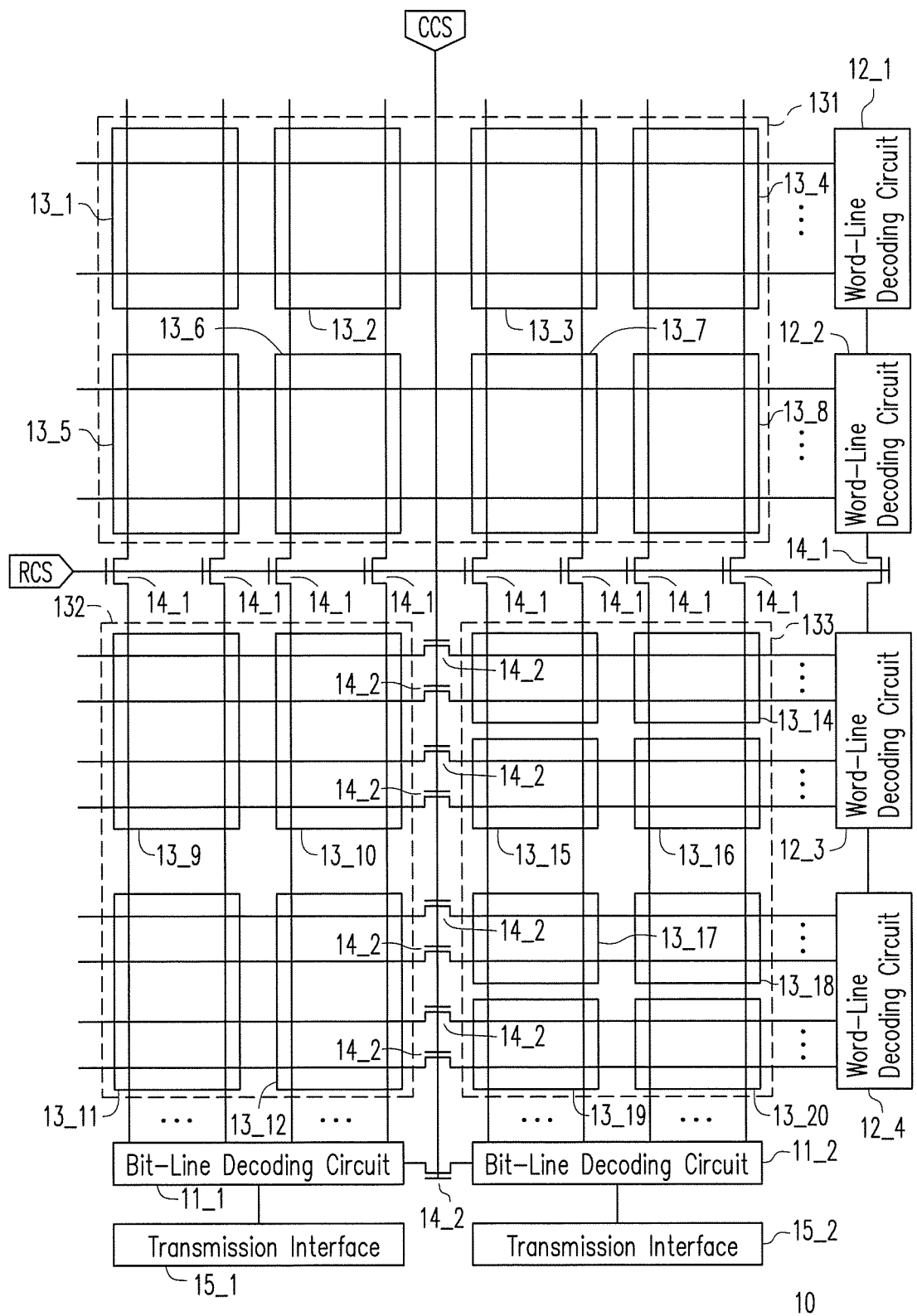

When the row control signal RCS and the column control signal CCS are both "1", the switches 14_1 and 14_2 are both turned on, and thus the first groups 131 and 132 and the second group 133 are all enabled (as illustrated in FIG. 3D). Besides, both transmission interfaces 15_1 and 15_2 may be used. In this case, the maximum frequency at which the memory device 10 may operate is the fourth operation frequency (e.g., the normal operation frequency), and the available memory capacity of the memory device 10 is the sum of the memory capacity of the memory blocks 13_1-13_20 (e.g., 12pq+8rs). In the present embodiment, the first operation frequency may be greater than the second operation frequency, and the second or third operation frequency may be greater than the fourth operation frequency.

Thus, under the normal circumstance or when greater memory capacity is needed, the row control signal and the column control signal may make the memory device 10 to operate at the fourth operation frequency (e.g., the normal operation frequency), and when the fast data access speed is needed, the row control signal and the column control signal may make the memory device 10 to operate at the first operation frequency (e.g., the maximum operation frequency), the second operation frequency, or the third operation frequency; thereby, the operation frequency of the memory device 10 may meet the requirements of processors or computer systems as much as possible. In addition, the row control signal and the column control signal may be set by a user. Alternatively, the row control signal and the column control signal may also be generated or adjusted automatically by a control circuit of the memory device 10, and the control circuit of the memory device 10 generates or adjusts the row control signal and the column control signal according to the address signal inputted or the system statuses such as the load of the processor coupled to the transmission interfaces 15_1-15_2, the number of cores in use, and/or the working frequency (or the clock)). The disclosure is not limited thereto.

In another embodiment, the memory blocks may be divided into even more groups by adding switches between the memory blocks so as to increase the number of the operation frequencies of the memory device and further increase the flexibility in using the memory device.

Second Embodiment

Figure 4:
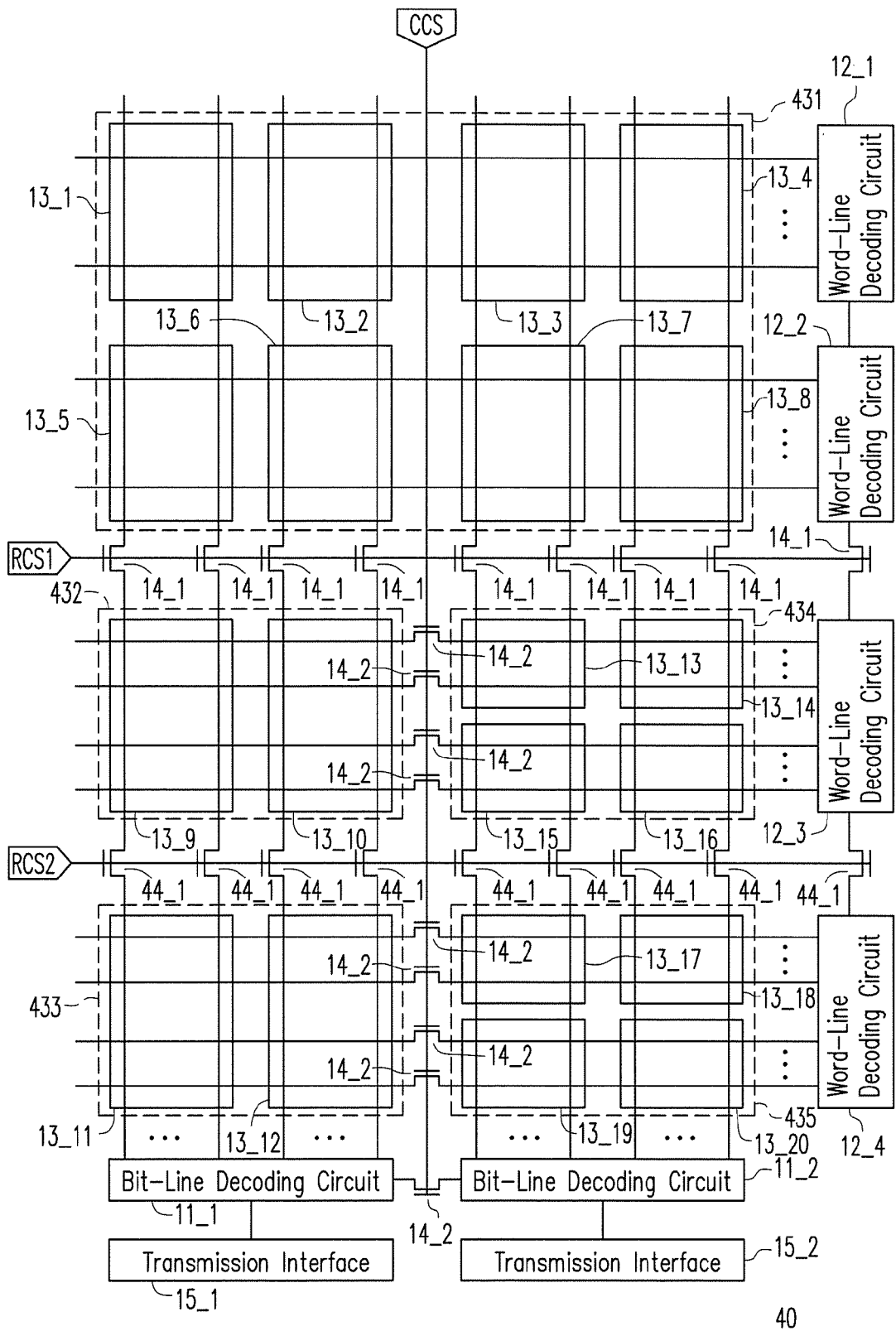
FIG. 4 is a schematic diagram of a memory device according to a second embodiment of the disclosure.

FIG. 4 is a schematic diagram of a memory device according to a second embodiment of the disclosure. As shown in FIG. 4, a memory device 40 includes the bit-line decoding circuits 11_1-11_2, the word-line decoding circuits 12_1-12_4, the memory blocks 13_1-13_20, the switches 14_1-14_2 and 44_1, and the transmission interfaces 15_1-15_2. The same components in FIG. 1A, FIG. 1B and FIG. 4 share the same reference numbers, and people reducing the disclosure to practice may refer to the detailed descriptions provided in the first embodiment for the same components. Similar to the first embodiment, the number of each component in FIG. 4 is merely exemplary, and those skilled in the art may adjust the number of each component according to the actual requirements.

In detail, the difference between the present embodiment and the first embodiment lies in that the present embodiment further includes the switches 44_1. In the present embodiment, the switches 14_1-14_2 and 44_1 may divide the memory blocks 13_1-13_20 into the first groups 431-433 and the second groups 434-435, wherein the switches 14_1 may receive the row control signal RCS1 (or is controlled by the row control signal RCS1), the switches 44_1 may receive the row control signal RCS2 (or is controlled by the row control signal RCS2), and the switches 14_2 may receive the column control signal CCS (or is controlled by the column control signal CCS). Thereby, the first groups 431-433 and the second group 434-435 may be enabled or disabled selectively according to the row control signals RCS1, RCS2 and the column control signal CCS.

In the following Table 2, different available memory capacities, transmission interfaces, and operation frequencies of the memory device 40 corresponding to different row control signals and column control signals are given. FIG. 5A through FIG. 5E are schematic diagrams of an enabling status of groups corresponding to different row control signals and column control signals according to the second embodiment of the disclosure. In addition, "1" in Table 2 represents the high level of the row control signal and the column control signal, "0" represents the low level of the row control signal and the column control signal, and "x" means a "don't-care" level of the row control signal or the column control signal, i.e., the "don't-care" level may be either high level or low level.

TABLE 2

| RCS1 | RCS2 | CCS | Available Memory Capacity | Transmission Interface Data Width | Operation Frequency |
|---|---|---|---|---|---|
| x | 0 | 0 | 4rs | Half | The first operation frequency (The maximum operation frequency) |
| 0 | 1 | 0 | 8rs | Half | The second operation frequency |
| x | 0 | 1 | 2pq + 4rs | All | The third operation frequency |
| 0 | 1 | 1 | 4pq + 8rs | All | The fourth operation frequency |
| 1 | 1 | 1 | 12pq + 8rs | All | The fifth operation frequency (The normal operation frequency) |

Figure 5A:
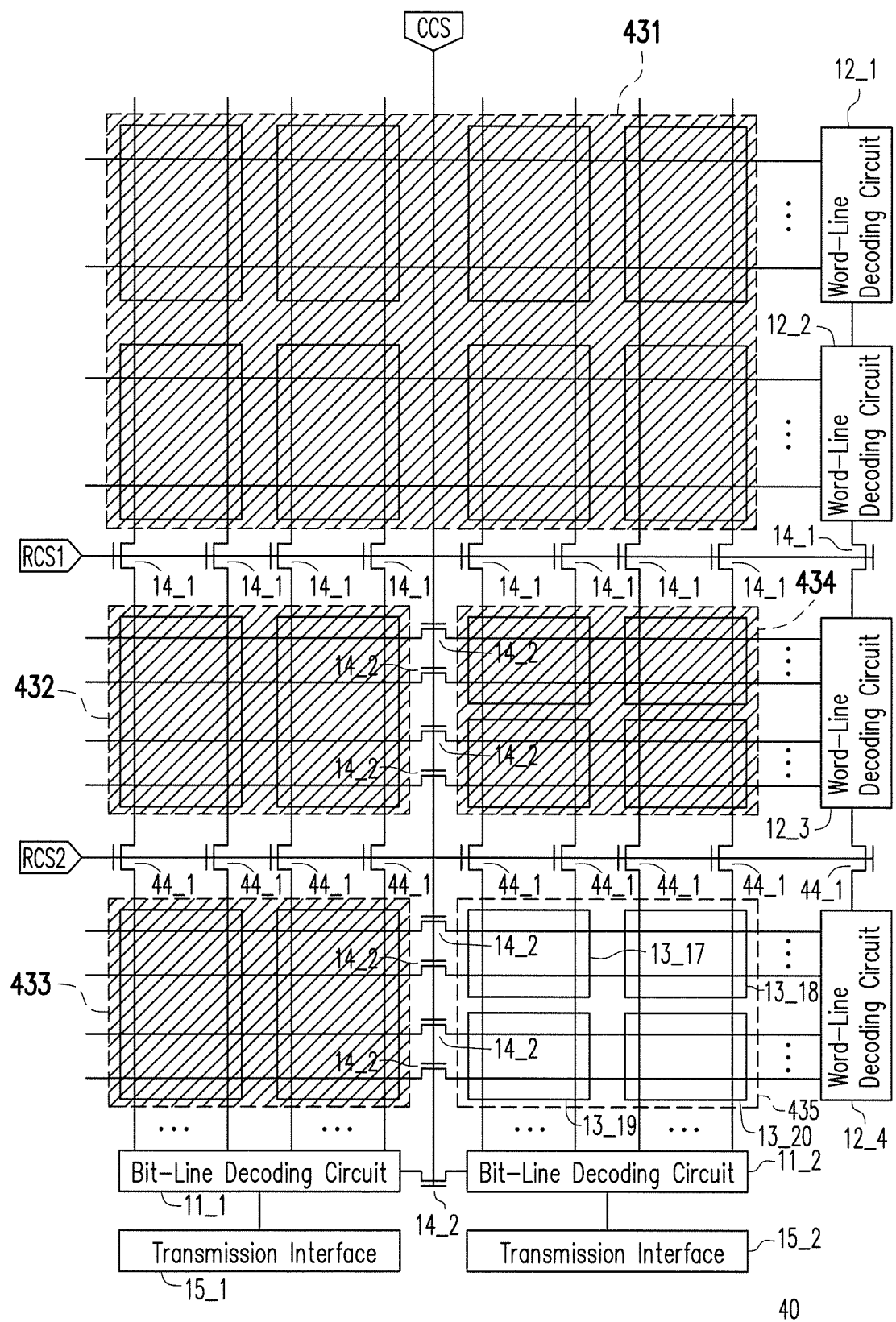
FIG. 5A through FIG. 5E are schematic diagrams of an enabling status of groups corresponding to different row control signals and column control signals according to the second embodiment of the disclosure.

As shown in Table 2 and FIG. 4, when the row control signal RCS2 and the column control signal CCS are both "0" (the row control signal RCS1 is of no significance), the switches 14_2 and 44_1 are turned off, such that the first groups 431-433 and the second group 434 are disabled, and that the second group 435 is enabled (as illustrated in FIG. 5A). Besides, the transmission interface 15_2 may be used. In this case, because the second group 435 is the closest group to the word-line decoding circuit 12_4 and the bit-line decoding circuit 11_2 and merely the transmission interface 15_2 is used for the memory device 40 to transmit data, the maximum frequency at which the memory device 40 may operate is the first operation frequency with the fastest data access speed (i.e., the maximum operation frequency), and the available memory capacity of the memory device 40 is the sum of the memory capacity of the memory blocks 13_17-13_20 (e.g., 4rs).

Figure 5B:
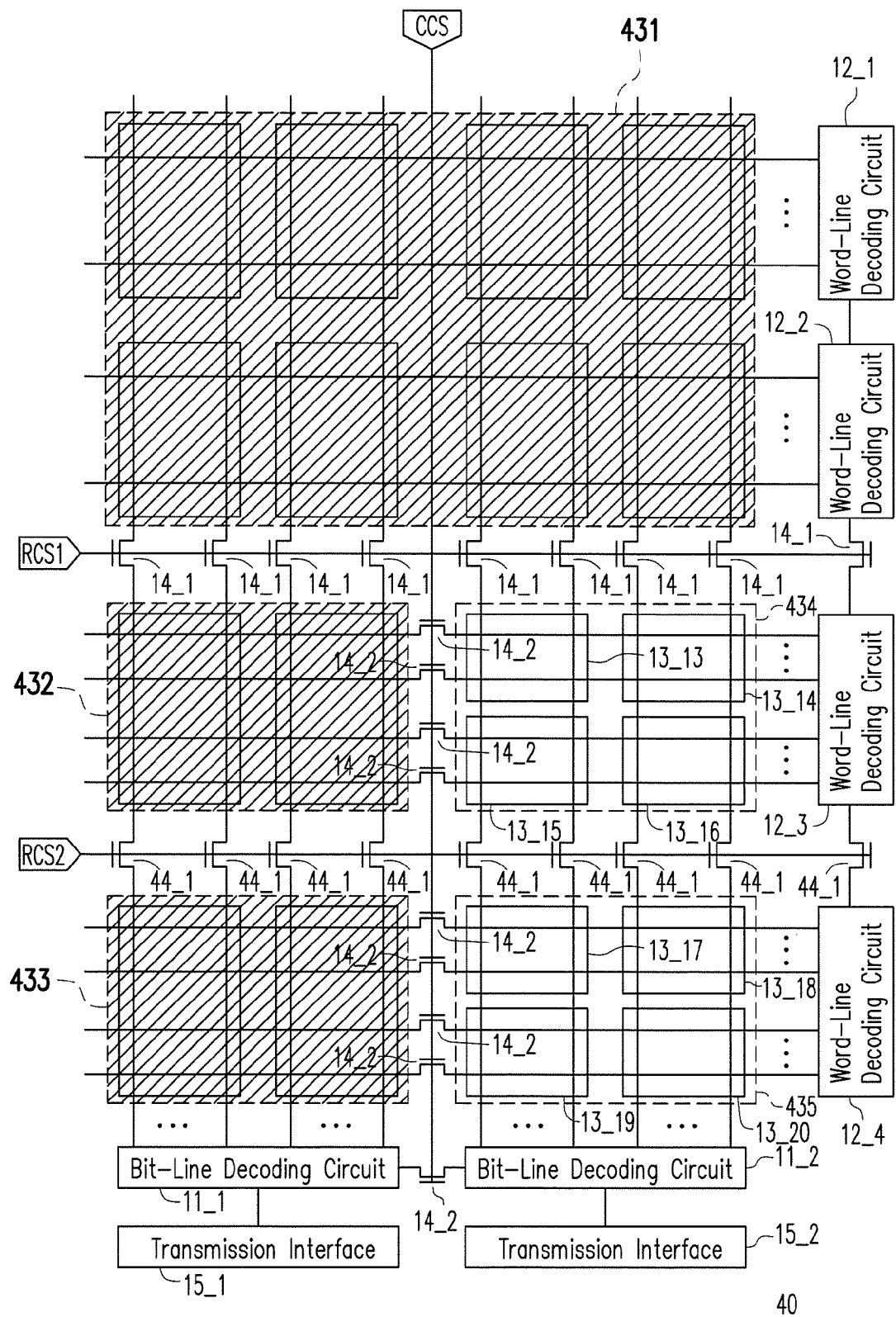

When the row control signal RCS1 is "0", the row control signal RCS2 is "1", and the column control signal CCS is "0", the switches 14_1-14_2 are turned off, and the switches 44_1 are turned on. Thus, the first groups 431-433 are disabled, the second groups 434-435 are enabled (as illustrated in FIG. 5B), and the transmission interface 15_2 is used. In this case, the maximum frequency at which the memory device 40 may operate is the second operation frequency, and the available memory capacity of the memory device 40 is the sum of the memory capacity of the memory blocks 13_13-13_20 (e.g., 8rs).

Figure 5C:
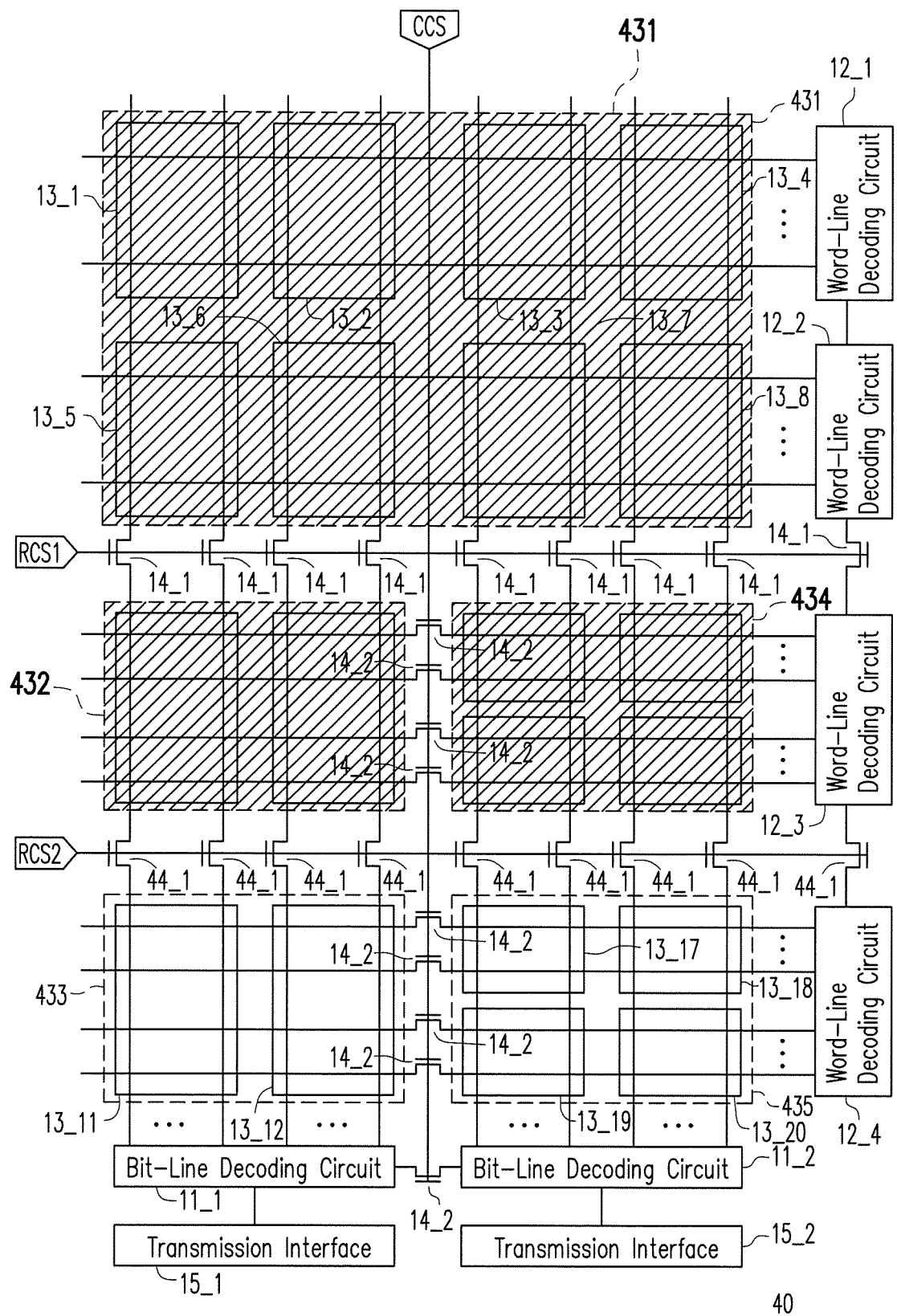

When the row control signal RCS2 is "0", and the column control signal CCS is "1" (the row control signal RCS 1 is of no significance), the switches 44_1 are turned off, and the switches 14_2 are turned on. Thus, the first group 433 and the second group 435 are both enabled (as illustrated in FIG. 5C), and both transmission interfaces 15_1 and 15_2 may be used. In this case, the maximum frequency at which the memory device 40 may operate is the third operation frequency, and the available memory capacity of the memory device 40 is the sum of the memory capacity of the memory blocks 13_11, 13_12, and 13_17-13_20 (e.g., 2pq+4rs).

Figure 5D:
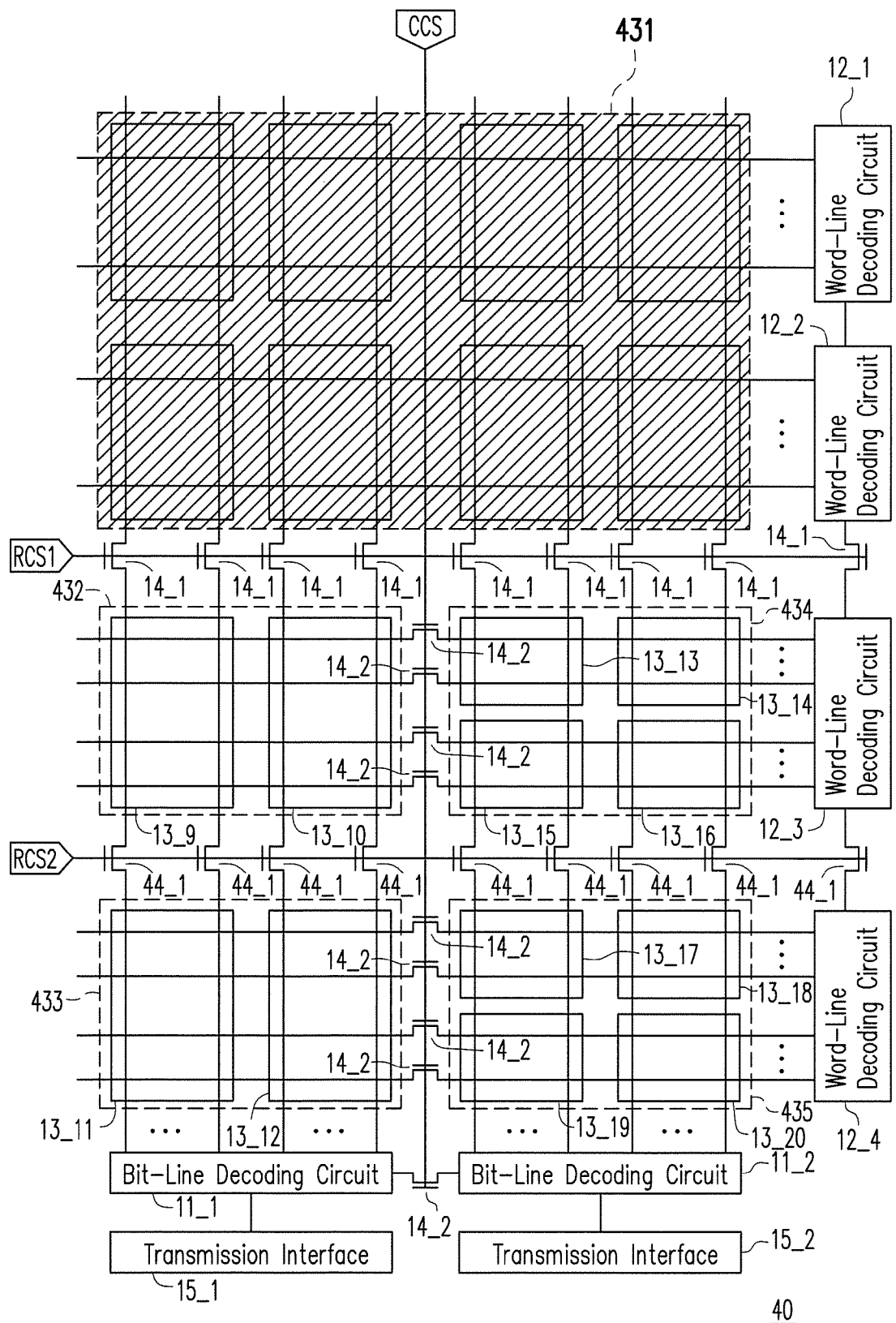

When the row control signal RCS1 is "0", and the row control signal RCS2 and the column control signal CCS are "1", the switches 14_1 are turned off, and the switches 14_2 and 44_1 are turned on. Thus, the first groups 432-433 and the second groups 431-435 are enabled (as illustrated in FIG. 5D), and both transmission interfaces 15_1 and 15_2 may be used. In this case, the maximum frequency at which the memory device 40 may operate is the fourth operation frequency, and the available memory capacity of the memory device 40 is the sum of the memory capacity of the memory blocks 13_9-13_20 (e.g., 4pq+8rs).

Figure 5E:
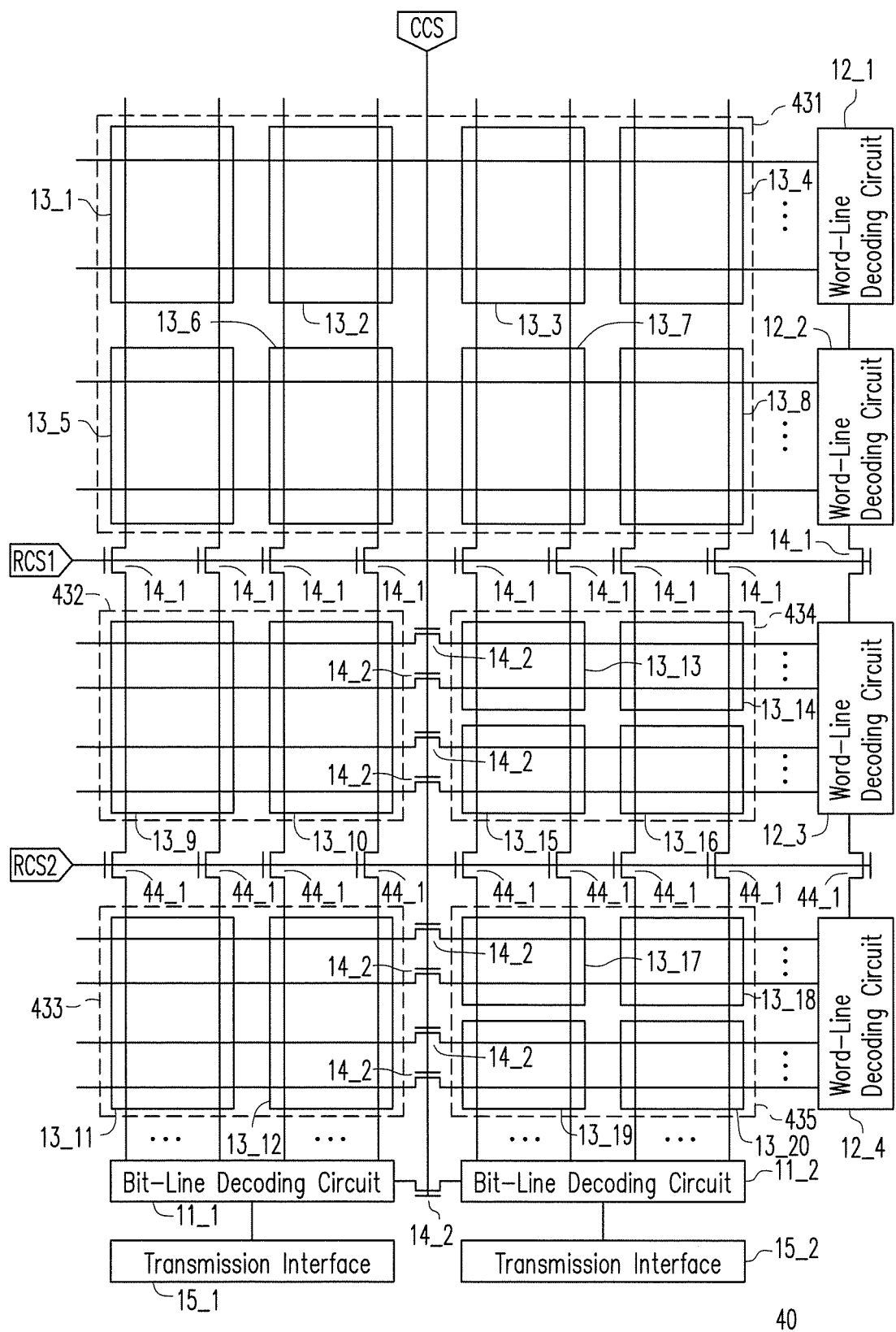

When the row control signals RCS1, RCS2 and the column control signal CCS are all "1", the switches 14_1-14_2 and 44_1 are all turned on, and thus the first groups 431-433 and the second group 434-435 are all enabled (as illustrated in FIG. 5E). Besides, both the transmission interfaces 15_1 and 15_2 may be used. In this case, the maximum frequency at which the memory device 40 may operate is the fifth operation frequency (e.g., the normal operation frequency), and the available memory capacity of the memory device 40 is the sum of the memory capacity of the memory blocks 13_1-13_20 (e.g., 12pq+8rs). In the present embodiment, the first operation frequency may be greater than each of the second, the third, and the fourth operation frequencies, and each of the second, the third, and the fourth operation frequencies may be different from one another and greater than the fifth operation frequency.

However, the disclosure is not limited to the aforementioned embodiments. In another embodiment, the size of the memory blocks that are enabled at the first operation frequency may be further decreased so as to further improve the data access speed of the memory device operating at the first operation frequency.

Third Embodiment

Figure 6A:
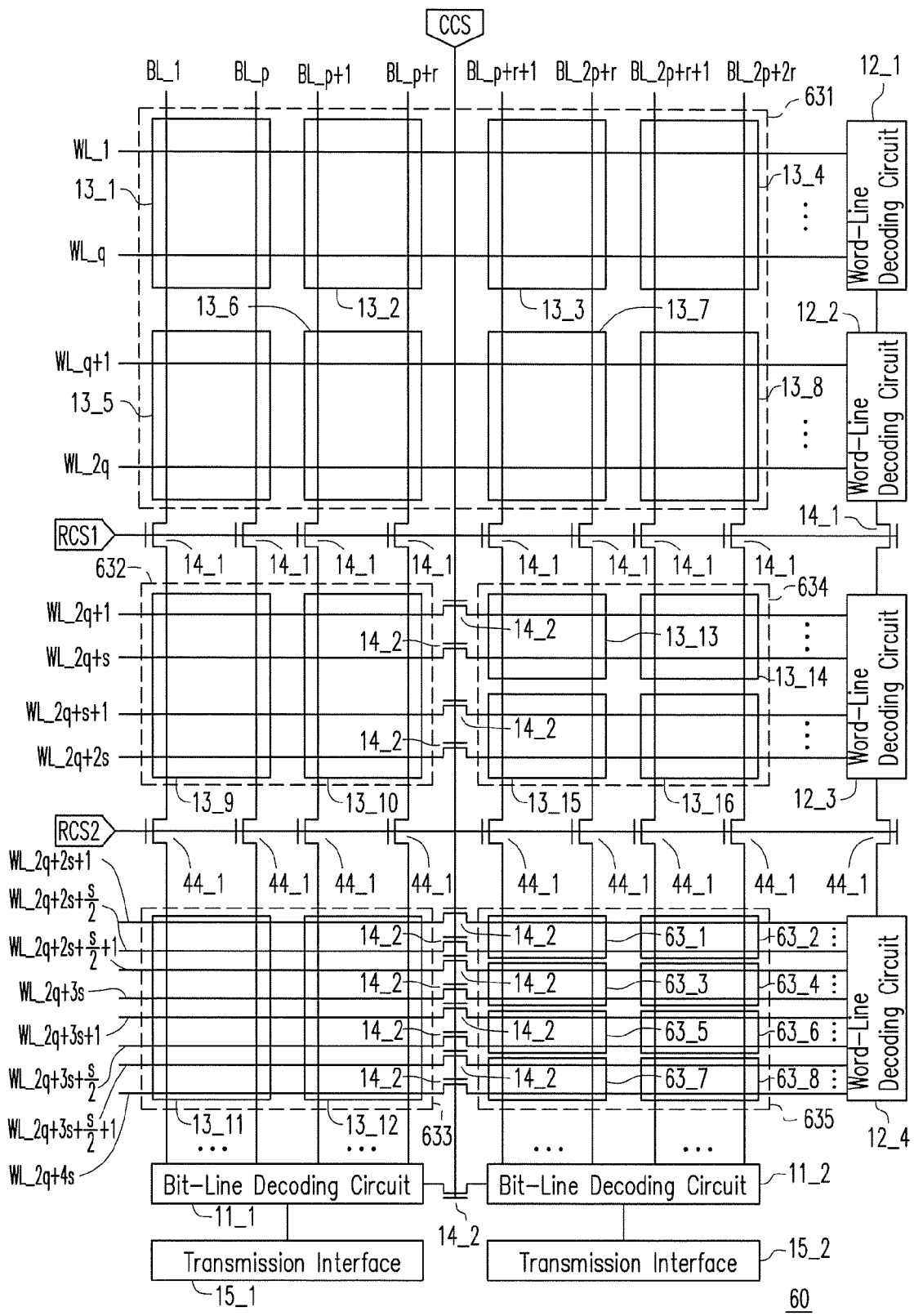
FIG. 6A and FIG. 6B are schematic diagrams of a memory device according to a third embodiment of the disclosure.
Figure 6B:
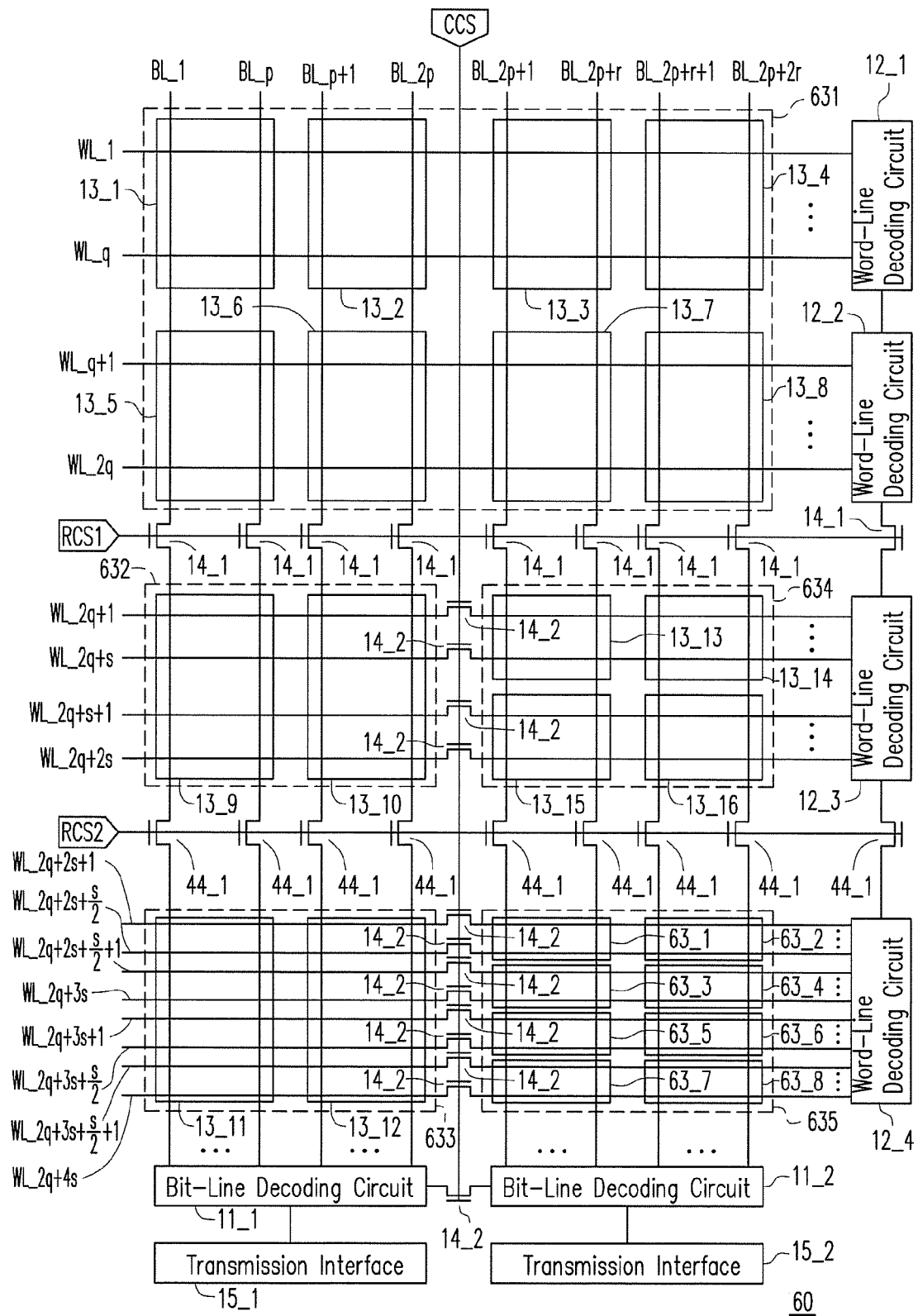

FIG. 6A and FIG. 6B are schematic diagrams of a memory device according to a third embodiment of the disclosure. As shown in FIG. 6A and FIG. 6B, the bit-line decoding circuit 11_1 in FIG. 6A has p+r bit lines, and the bit-line decoding circuit 11_1 in FIG. 6B has 2p bit lines. A memory device 60 includes the bit-line decoding circuits 11_1-11_2, the word-line decoding circuits 12_1-12_4, the memory blocks 13_1-13_16 and 63_1-63_8, the switches 14_1-14_2 and 44_1, and the transmission interfaces 15_1-15_2. The same components in FIG. 1A, FIG. 1B, FIG. 4, FIG. 6A, and FIG. 6B share the same reference numbers, and people reducing the disclosure to practice may refer to the detailed descriptions provided in the first and second embodiments for the same components. Similar to the first and second embodiments, the number of each component in FIG. 6A and FIG. 6B are merely exemplary, and those skilled in the art may adjust the number of each component according to the actual requirements.

In detail, the differences between the present embodiment and the second embodiment are, in FIGS. 6A and 6B of the present embodiment, the word-line decoding circuit 12_4 has the word lines WL_2q+2s+1-WL_2q+2s+s/2, WL_2q+2s+ s/2+1-WL__2q+3s, WL__2q+3s+1-WL__2q+3s+s/2, and WL_q+3s+s/2+1-WL__2q+4s. Besides, the word-line decoding circuit 12_4 is coupled to the memory blocks 13_11, 13_12, and 63_1-63_8 through the word lines WL__2q+2s+1-WL__2q+2s+s/2, WL__2q+2s+s/2+1-WL__2q+3s, WL__2q+3s+1-WL__2q+3s+s/2, and WL_q+3s+s/2+1-WL__2q+4s. In addition, in the present embodiment, the memory blocks 13_1-13_12 have the first size, the memory blocks 13_13-13_16 have the second size, and the memory blocks 63_1-63_8 have the third size.

Figure 7:
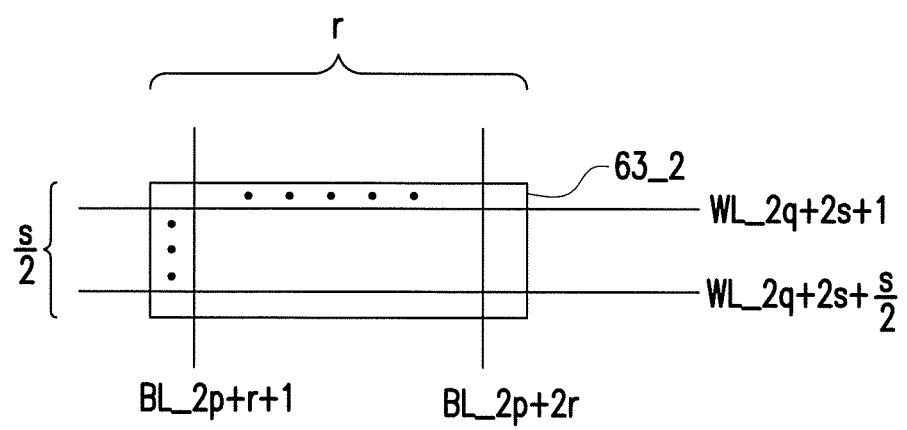
FIG. 7 is a schematic diagram of the memory block having the third size according to the third embodiment of the disclosure.

For example, FIG. 7 is a schematic diagram of the third size according to the third embodiment of the disclosure. As shown in FIG. 7, since r bit lines (i.e., bit lines BL__2p+r+1-BL__2p+2r, and p equals r in the present embodiment) and s/2 word lines (i.e., word lines WL__2q+2s+1-WL__2q+2s+s/2) are included by and pass through the exemplary memory block 63_2, the third size or the memory capacity of the memory block 63_2 may be represented by rs/2 (or r×s/2). In other words, in the present embodiment, for example, the second size is half of the first size, and the third size is a quarter of the first size. Alternatively, the available memory capacity of the memory blocks having the second size is half of the memory capacity of the memory blocks having the first size, and the available memory capacity of the memory blocks having the third size is a quarter of the memory capacity of the memory blocks having the first size, which should however not be construed as limitations to the disclosure. For example, in one embodiment, as long as the number of the bit lines and/or the number of word lines passing through the memory blocks are/is changed, the aforementioned first size, second size, and/or third size are/is changed as well.

It is worth mentioning that even though p is set to be equal to r in the present embodiment, so that the number of bit lines included by or passing through the memory blocks having the first size (e.g., the memory blocks 13_1-13_12) is the same as the number of bit lines included by or passing through the memory blocks having the second size (e.g., the memory blocks 13_13-13_16) and the number of bit lines included by or passing through the memory blocks having the third size (e.g., the memory blocks 63_1-63_8). However, in another embodiment, r may be less than p; for example, r may be p/2, p/3, or p/4. That is, the number of the bit lines included by or passing through each memory block having the second size and the number of the bit lines included by or passing through each memory block having the third size may be respectively less than the number of bit lines included by or passing through each memory block having the first size.

As shown in FIG. 6A and FIG. 6B, the memory blocks 13_1-13_12 having the first size may be grouped as the first groups 631 and 633, the memory blocks 13_13-13_16 having the second size may be grouped as the second group 634, and the memory blocks 63_1-63_8 having the third size may be grouped as the third group 635. In the present embodiment, the ratio of the number of the memory blocks 13_1-13_12 (e.g., 12) to the sum of the number of the memory blocks 13_13-13_16 and the number of the memory blocks 63_1~63_8 (e.g., 4+8=12) is 1:1. In addition, compared to the second group 634 and the first groups 631-633, the third group 635 is closer to the word-line decoding circuits 12_1-12_4 and the bit-line decoding circuits 11_1-11_2. The word-line decoding circuit 12_4 is adjacent to the third group 635. The bit-line decoding circuit 11_1 is adjacent to the first group 633, and the bit-line decoding circuit 11_2 is adjacent to the third group 635. The distances between the bit-line decoding circuit 11_1 and the word-line decoding circuit 12_1-12_2 is greater than the distance between the bit-line decoding circuit 11_2 and the word-line decoding circuit 12_3 respectively; the distance between the bit-line decoding circuit 11_1 and the word-line decoding circuit 12_3 is greater than the distance between the bit-line decoding circuit 11_2 and the word-line decoding circuit 12_3; the distance between the bit-line decoding circuit 11_2 and the word-line decoding circuit 12_3 of the second group 634 is greater than the distance between the bit-line decoding circuit 11_2 and the word-line decoding circuit 12_4. However, the disclosure does not limit the numbers of the second groups and the third groups. For example, in another embodiment, the memory blocks 13_13-13_16 having the second size may be grouped as a plurality of the second groups, and/or the memory blocks 63_1-63_8 having the third size may also be grouped a plurality of the third groups. In addition, when the number of the second group and/or the number of the third group are/is more than one, the switches for receiving the row control signals and/or the column control signals may be added according to the actual requirements. Especially, the third group 635 will not be disabled in the present embodiment.

In the present embodiment, the word-line decoding circuits 12_1-12_2 are adjacent to the first group 631, the word-line decoding circuit 12_3 is adjacent to the second group 634, and the word-line decoding circuit 12_4 is adjacent to the third group 635. The bit-line decoding circuit 11_1 is adjacent to the first group 633, and the bit-line decoding circuit 11_2 is adjacent to the third group 635.

Especially, the third size is smaller than the second size. Therefore, compared to the second embodiment, the present embodiment discloses that the first operation frequency of the memory device 60 may be faster than that of the memory device 40 when the row control signal RCS2 and the column control signal CCS are "0" (the row control signal RCS1 is of no significance).

Figure 8:
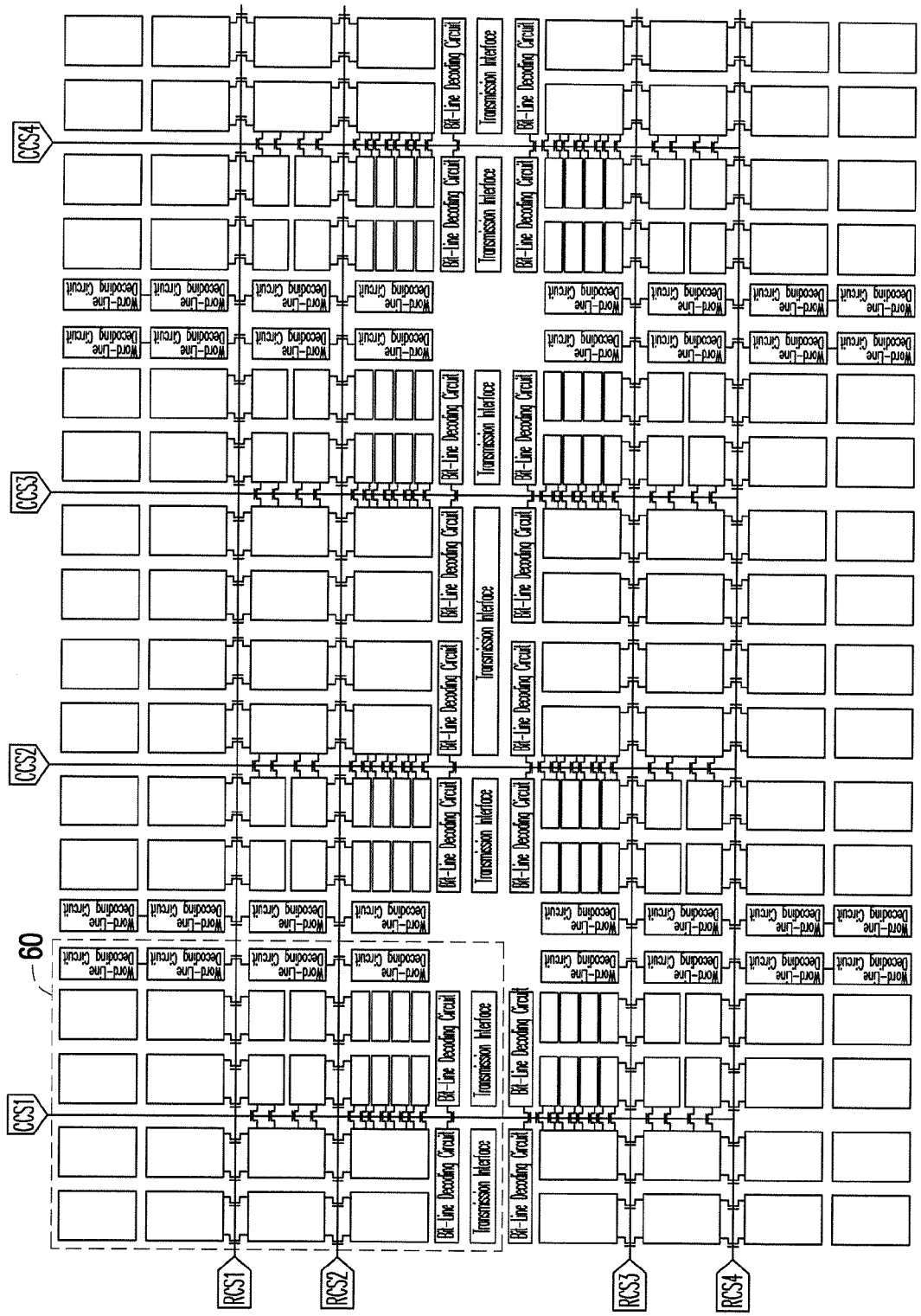
FIG. 8 is a schematic diagram of integrated memory devices according to the third embodiment of the disclosure.

FIG. 8 is a schematic diagram of integrated memory devices according to the third embodiment of the disclosure. As shown in FIG. 8, a memory device 80 is formed by integrating a plurality of the memory devices 60. Similar to the aforementioned embodiments, the memory device 80 may receive the row control signals RCS1-RCS4 and the column control signals CCS1-CCS4 and enable or disable each memory group in the memory device 80 according to the row control signals RCS1-RCS4 and the column control signals CCS1-CCS4, so as to adjust the operation frequency of the memory device 80 adaptively.

Figure 9:
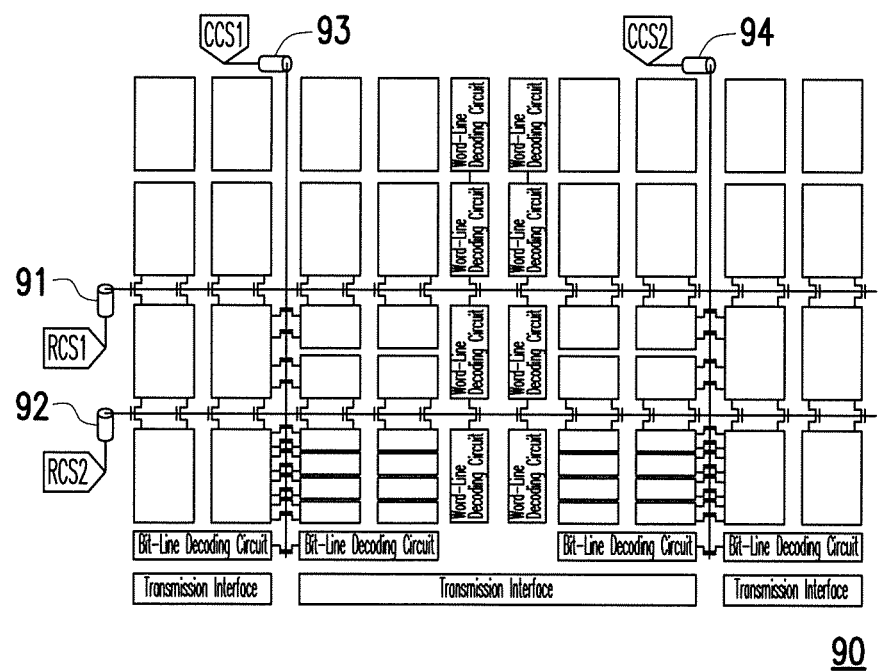
FIG. 9 is a schematic diagram of stacked memory devices according to the third embodiment of the disclosure.

In addition, the memory device provided in the disclosure is applicable to a three-dimensional memory array. For example, FIG. 9 is a schematic diagram of stacked memory devices according to the third embodiment of the disclosure. With reference to FIG. 9, a memory device 90 includes a three-dimensional memory array formed by stacking the memory blocks in the memory device 60, and the row control signals RCS1-RCS2 and the column control signals CCS1-CCS2 are transmitted to each memory layer of the three-dimensional memory array through through-silicon vias (TSV) 91-94.

To sum up, in the memory device provided in the disclosure, the positions of the available memory blocks as well as the entire memory capacity may be adjusted adaptively, so that the processor of the electronic device may choose the proper operation frequency of the memory device according actual requirements. For example, the memory device provided in the disclosure has a plurality of memory blocks with different sizes and memory capacities, and the memory blocks are divided into a plurality of groups according to their sizes and/or memory capacities. The memory blocks in some of the groups may be enabled or disabled selectively through different control signals, so as to adjust the data access speed or the operation frequency of the memory device and effectively improve the flexibility in using the memory device.

Especially, the memory device of the disclosure may be configured in a computer system or an electronic device. The control signals may be generated automatically according to the address signal inputted or the system status of the processor of the computer system or the electronic device, and the system status may refer to the load, the number of cores in use, and the working frequency (or the clock).

In addition, when the computer system or the electronic device using the memory device described in the disclosure is in a standby mode or an idle mode, the computer system or the electronic device may disable the memory blocks that are not in use so as to lower the power consumption. When the computer system or the electronic device resumes back to normal, some or all of the memory blocks are enabled according to the actual needs, so as to improve the working efficiency.

It will be apparent to those skilled in the art that various modifications and variations could be made to the disclosed embodiments. It is intended that the specification and examples be considered as exemplary merely, with a true scope of the disclosure being indicated by the following claims and their equivalents.

What is claimed is:

1. A memory device comprising:
   at least one bit-line decoding circuit and at least one word-line decoding circuit;
   a plurality of memory blocks coupled to the at least one bit-line decoding circuit and the at least one word-line decoding circuit, sizes of the plurality of memory blocks at least comprising a first size and a second size, wherein the first size is greater than the second size, the plurality of memory blocks having the first size are grouped as at least one first group, the plurality of memory blocks having the second size are grouped as at least one second group, and in comparison with the at least one first group, the at least one second group is located closer to the at least one word-line decoding circuit and/or the at least one bit-line decoding circuit; and
   a plurality of switches coupled to the at least one first group and the at least one second group and controlled by at least one control signal, so as to enable or disable the at least one first group and/or the at least one second group according to the at least one control signal.

2. The memory device according to claim 1, wherein the at least one control signal comprises at least one row control signal and/or at least one column control signal; and
   a number of the at least one bit-line decoding circuit and/or a number of the at least one word-line decoding circuit are/is plural.

3. The memory device according to claim 1, wherein the switches are further coupled between the at least one first group and/or between the at least one second group.

4. The memory device according to claim 2, wherein the switches are further coupled between the at least one word-line decoding circuit, and the switches enable or disable the at least one word-line decoding circuit according to the at least one row control signal.

5. The memory device according to claim 2, wherein the switches are further coupled between the at least one bit-line decoding circuit, and the switches enable or disable the at least one bit-line decoding circuit according to the at least one column control signal.

6. The memory device according to claim 5, wherein the at least one bit-line decoding circuit is further coupled to at least one transmission interface,
   wherein when at least one first bit-line decoding circuit of the at least one bit-line decoding circuit is enabled, at least one first transmission interface of the at least one transmission interface is also enabled, wherein the at least one first transmission interface is coupled to the at least one first bit-line decoding circuit,
   wherein when at least one second bit-line decoding circuit of the at least one bit-line decoding circuit is disabled, at least one second transmission interface of the at least one transmission interface is also disabled, wherein the at least one second transmission interface is coupled to the at least one second bit-line decoding circuit.

7. The memory device according to claim 6, wherein the at least one transmission interface is further coupled to at least one processor.

8. The memory device according to claim 1, wherein at least one first word-line decoding circuit of the at least one word-line decoding circuit is adjacent to one of the at least one first group, and at least one second word-line decoding circuit of the at least one word-line decoding circuit is adjacent to the at least one second group.

9. The memory device according to claim 8, wherein at least one first bit-line decoding circuit of the at least one bit-line decoding circuit is adjacent to one of the at least one first group, and at least one second bit-line decoding circuit of the at least one bit-line decoding circuit is adjacent to one of the at least one second group.

10. The memory device according to claim 9, wherein a distance between the at least one first bit-line decoding circuit and the at least one first word-line decoding circuit is greater than a distance between the at least one second bit-line decoding circuit and the at least one second word-line decoding circuit.

11. The memory device according to claim 1, wherein available memory capacity of each of the plurality of memory blocks having the second size is half of available memory capacity of each of the plurality of memory blocks having the first size.

12. The memory device according to claim 1, wherein a ratio of a number of the plurality of memory blocks in the at least one first group to a number of the plurality of memory blocks in the at least one second group is 3:2.

13. The memory device according to claim 1, wherein the sizes of the plurality of memory blocks further comprise a third size, the third size is less than the second size, the plurality of memory blocks having the third size are grouped as at least one third group, and in comparison with the at least one second group, the at least one third group is closer to the at least one word-line decoding circuit and/or the at least one bit-line decoding circuit.

14. The memory device according to claim 13, wherein the switches are further coupled between the at least one second group, between the at least one third group, and/or between the at least one second group and the at least one third group.

15. The memory device according to claim 13, wherein the at least one third group is not disabled.

16. The memory device according to claim 13, wherein available memory capacity of each of the plurality of memory blocks having the second size is half of available memory capacity of each of the plurality of memory blocks having the first size, and available memory capacity of each of the plurality of memory blocks having the third size is a quarter of the available memory capacity of each of the plurality of memory blocks having the first size.

17. The memory device according to claim 13, wherein a ratio of a number of the plurality of memory blocks in the at least one first group to a sum of the number of the plurality of memory blocks in the at least one second group and a number of the plurality of memory blocks in the at least one third group is 1:1.

18. The memory device according to claim 13, wherein at least one first word-line decoding circuit of the at least one word-line decoding circuit is adjacent to one of the at least one first group, at least one second word-line decoding circuit of the at least one word-line decoding circuit is adjacent to the at least one second group, and at least one third word-line decoding circuit of the at least one word-line decoding circuit is adjacent to the at least one third group.

19. The memory device according to claim 18, wherein at least one first bit-line decoding circuit of the at least one bit-line decoding circuit is adjacent to one of the at least one first group, and at least one second bit-line decoding circuit of the at least one bit-line decoding circuit is adjacent to the at least one third group.

20. The memory device according to claim 19, wherein a distance between the at least one first bit-line decoding circuit and the at least one first word-line decoding circuit is greater than a distance between the at least one second bit-line decoding circuit and the at least one second word-line decoding circuit, and a distance between the at least one second bit-line decoding circuit and the at least one second word-line decoding circuit is greater than a distance between the at least one second bit-line decoding circuit and the at least one third word-line decoding circuit.

21. The memory device according to claim 2, further comprising a three-dimensional memory array stacked by the plurality of memory blocks, and the at least one column control signal and/or the at least one row control signal are/is transmitted to each memory layer of the three-dimensional memory array through a corresponding through-silicon via, respectively.

22. The memory device according to claim 1, further comprising a non-volatile memory device.

23. A memory device comprising
at least one bit-line decoding circuit and at least one word-line decoding circuit;
a plurality of memory blocks coupled to the at least one bit-line decoding circuit and the at least one word-line decoding circuit, sizes of the plurality of memory blocks at least comprising a first size and a second size, wherein the first size corresponds to first memory capacity of p bit lines and q word lines, the second size corresponds to second memory capacity of r bit lines and s word lines, a product of p and q is greater than a product of r and s, the plurality of memory blocks having the first size are grouped as at least one first group, the plurality of memory blocks having the second size are grouped as at least one second group, and in comparison with the at least one first group, the at least one second group is closer to the at least one word-line decoding circuit and/or the at least one bit-line decoding circuit; and a plurality of switches coupled between the at least one first group and the at least one second group, wherein the switches are controlled by at least one control signal, so as to enable or disable the at least one first group and/or the at least one second group according to the at least one control signal.

24. The memory device according to claim 23, wherein the at least one control signal comprises at least one row control signal and/or at least one column control signal, and a number of the at least one bit-line decoding circuit and/or a number of the at least one word-line decoding circuit are/is plural.

25. The memory device according to claim 23, wherein the switches are further coupled between the at least one first group and/or between the at least one second group.

26. The memory device according to claim 23, wherein the sizes of the plurality of memory blocks further comprise a third size, the third size is less than the second size, the plurality of memory blocks having the third size are grouped as at least one third group, and in comparison with the at least one second group, the at least one third group is closer to the at least one word-line decoding circuit and/or the at least one bit-line decoding circuit.

27. The memory device according to claim 26, wherein the switches are further coupled between the at least one second group, between the at least one third group, and/or between the at least one second group and the at least the third group.

* * * * *